(12) United States Patent
Chiang et al.

(10) Patent No.: US 10,134,640 B1
(45) Date of Patent: Nov. 20, 2018

(54) SEMICONDUCTOR DEVICE STRUCTURE WITH SEMICONDUCTOR WIRE

(71) Applicant: Taiwan Semiconductor Manufacturing Co., Ltd., Hsinchu (TW)

(72) Inventors: Hung-Li Chiang, Taipei (TW); I-Sheng Chen, Taipei (TW); Tzu-Chiang Chen, Hsinchu (TW); Chao-Ching Cheng, Hsinchu (TW); Chih-Chieh Yeh, Taipei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/652,628

(22) Filed: Jul. 18, 2017

(51) Int. Cl.
*H01L 21/8238* (2006.01)
*H01L 29/66* (2006.01)
(Continued)

(52) U.S. Cl.
CPC .......... *H01L 21/823807* (2013.01); *H01L 21/02603* (2013.01); *H01L 21/823814* (2013.01); *H01L 21/823828* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/66545* (2013.01); *H01L 29/7848* (2013.01); *H01L 29/78618* (2013.01); *H01L 29/78651* (2013.01); *H01L 29/78684* (2013.01); *H01L 29/78696* (2013.01)

(58) Field of Classification Search
CPC ....... H01L 21/823807; H01L 21/02603; H01L 21/823828; H01L 21/823814; H01L 27/092; H01L 29/0649; H01L 29/0673; H01L 29/42392; H01L 29/7848; H01L 29/66545; H01L 29/78618; H01L 29/78651; H01L 29/78684; H01L 29/78696
See application file for complete search history.

(56) References Cited

U.S. PATENT DOCUMENTS 9,209,247 B2  12/2015  Colinge et al.
9,236,267 B2  1/2016   De et al.
(Continued)

*Primary Examiner* — Cheung Lee
*Assistant Examiner* — Stephen C Smith
(74) *Attorney, Agent, or Firm* — McClure, Qualey & Rodack, LLP

(57) ABSTRACT

A semiconductor device structure is provided. The semiconductor device structure includes a substrate having a base portion and a fin portion over the base portion. The semiconductor device structure includes a gate structure over the fin portion and extending across the fin portion. The semiconductor device structure includes a first semiconductor wire over the fin portion and passing through the gate structure. The semiconductor device structure includes a second semiconductor wire over the first semiconductor wire and passing through the gate structure. The gate structure surrounds the second semiconductor wire and separates the first semiconductor wire from the second semiconductor wire. The first semiconductor wire and the second semiconductor wire are made of different materials.

20 Claims, 26 Drawing Sheets

(51) Int. Cl.
*H01L 29/423* (2006.01)
*H01L 29/06* (2006.01)
*H01L 29/78* (2006.01)
*H01L 29/786* (2006.01)
*H01L 27/092* (2006.01)
*H01L 21/02* (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,735,176 B2 * | 8/2017 | Balakrishnan ...... H01L 27/1211 |
| 9,837,414 B1 * | 12/2017 | Balakrishnan ...... H01L 27/0921 |
| 2014/0131660 A1 * | 5/2014 | Cea ................... H01L 29/42392 257/24 |
| 2017/0194357 A1 * | 7/2017 | Balakrishnan ...... H01L 29/0673 |
| 2017/0294358 A1 * | 10/2017 | Cheng ............. H01L 21/823807 |

\* cited by examiner

SEMICONDUCTOR DEVICE STRUCTURE WITH SEMICONDUCTOR WIRE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1H-1 is a top view of the semiconductor device structure of FIG. 1H, in accordance with some embodiments.

FIG. 1H-2 is a cross-sectional view illustrating the semiconductor device structure along a sectional line I-I' in FIG. 1H-1, in accordance with some embodiments.

FIG. 1I-1 is a top view of the semiconductor device structure of FIG. 1I, in accordance with some embodiments.

FIG. 1I-2 is a cross-sectional view illustrating the semiconductor device structure along a sectional line I-I' in FIG. 1I-1, in accordance with some embodiments.

FIG. 1J-1 is a top view of the semiconductor device structure of FIG. 1J, in accordance with some embodiments.

FIG. 1J-2 is a cross-sectional view illustrating the semiconductor device structure along a sectional line I-I' in FIG. 1J-1, in accordance with some embodiments.

FIG. 1J-3 is a cross-sectional view illustrating the semiconductor device structure along a sectional line II-II' in FIG. 1J-1, in accordance with some embodiments.

FIG. 3C-1 is a top view of the semiconductor device structure of FIG. 3C, in accordance with some embodiments.

FIG. 3C-2 is a cross-sectional view illustrating the semiconductor device structure along a sectional line I-I' in FIG. 3C-1, in accordance with some embodiments.

FIG. 3C-3 is a cross-sectional view illustrating the semiconductor device structure along a sectional line II-II' in FIG. 3C-1, in accordance with some embodiments.

DETAILED DESCRIPTION

Figure 1A:
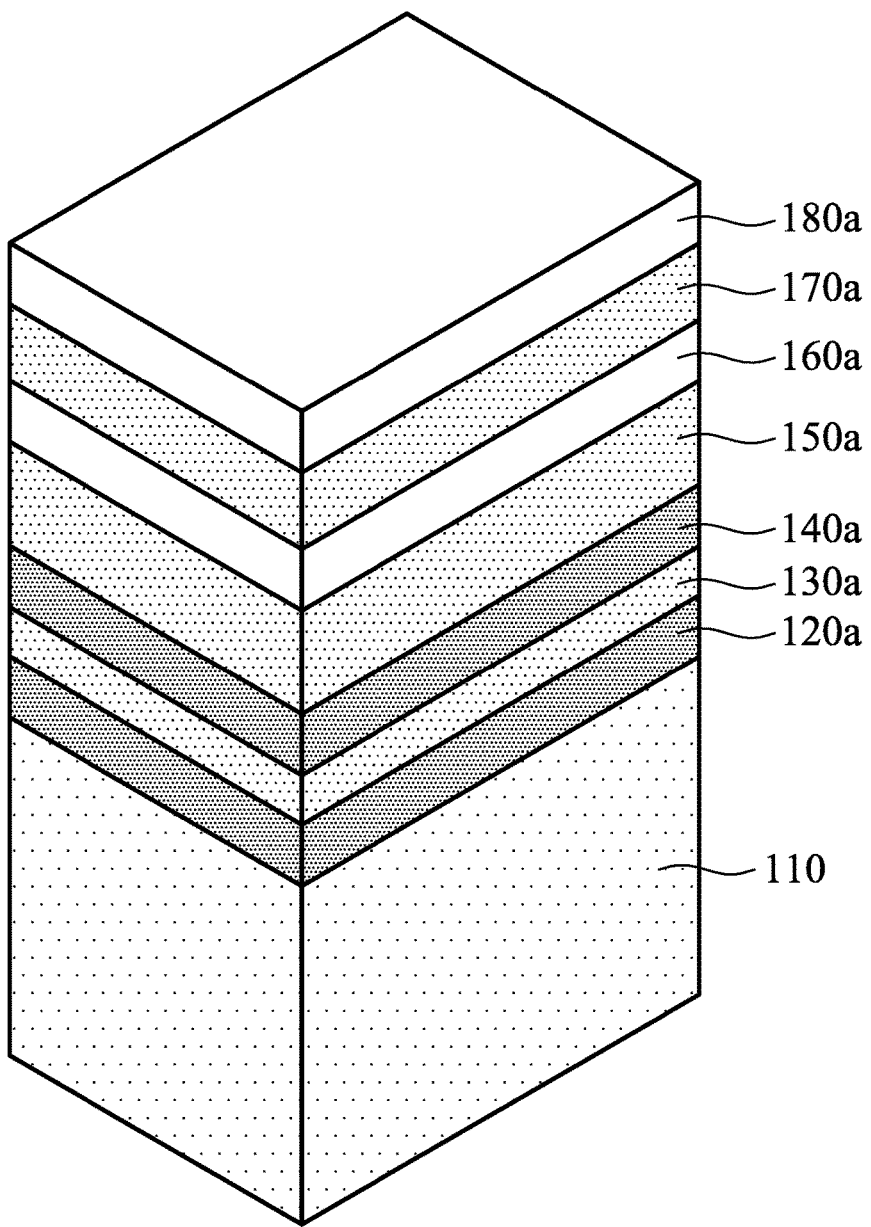
FIGS. 1A-1J are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1J are cross-sectional views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, a semiconductor layer 120a is formed over the substrate 110, in accordance with some embodiments. The semiconductor layer 120a is in direct contact with the substrate 110, in accordance with some embodiments. The semiconductor layer 120a is made of $Si_XGe_{1-X}$, and X ranges from about 0.5 to about 0.9, in accordance with some embodiments. In some embodiments, X ranges from about 0.55 to about 0.7.

In some embodiments, the semiconductor layer 120a is made of III-V compound semiconductor materials, such as AlGaN. In some embodiments, the semiconductor layer 120a is made of II-VI compound semiconductor materials. The semiconductor layer 120a and the substrate 110 are made of different materials, in accordance with some embodiments. The semiconductor layer 120a is formed using an epitaxy process, in accordance with some embodiments.

As shown in FIG. 1A, a dummy layer 130a is formed over the semiconductor layer 120a, in accordance with some embodiments. When the semiconductor layer 120a is made of $Si_XGe_{1-X}$, the dummy layer 130a is made of Ge, in accordance with some embodiments. When the semiconductor layer 120a is made of III-V compound semiconductor materials (e.g., AlGaN), the dummy layer 130a is made of III-V compound semiconductor materials, such as GaAs. The dummy layer 130a is formed using an epitaxy process, in accordance with some embodiments.

As shown in FIG. 1A, a semiconductor layer 140a is formed over the dummy layer 130a, in accordance with some embodiments. The semiconductor layer 140a is made of $Si_XGe_{1-X}$, and X ranges from about 0.5 to about 0.9, in accordance with some embodiments. In some embodiments, X ranges from about 0.55 to about 0.7.

In some embodiments, the semiconductor layer 140a is made of III-V compound semiconductor materials, such as AlGaN. In some embodiments, the semiconductor layer 140a is made of II-VI compound semiconductor materials. The semiconductor layer 140a is formed using an epitaxy process, in accordance with some embodiments.

As shown in FIG. 1A, a dummy layer 150a is formed over the semiconductor layer 140a, in accordance with some embodiments. When the semiconductor layer 140a is made of $Si_XGe_{1-X}$, the dummy layer 150a is made of Ge, in accordance with some embodiments. When the semiconductor layer 140a is made of III-V compound semiconductor materials (e.g., AlGaN), the dummy layer 150a is made of III-V compound semiconductor materials, such as GaAs. The dummy layer 150a is formed using an epitaxy process, in accordance with some embodiments.

As shown in FIG. 1A, a semiconductor layer 160a is formed over the dummy layer 150a, in accordance with some embodiments. The semiconductor layer 160a is made of silicon or the like, in accordance with some embodiments. In some embodiments, the semiconductor layer 160a is made of III-V compound semiconductor materials, such as GaN.

In some embodiments, the semiconductor layer 160a is made of II-VI compound semiconductor materials. The semiconductor layer 160a and the substrate 110 mad of the same material, such as silicon, in accordance with some embodiments. The semiconductor layer 160a is formed using an epitaxy process, in accordance with some embodiments.

As shown in FIG. 1A, a dummy layer 170a is formed over the semiconductor layer 160a, in accordance with some embodiments. When the semiconductor layer 160a is made of $Si_XGe_{1-X}$, the dummy layer 170a is made of Ge, in accordance with some embodiments. When the semiconductor layer 140a is made of III-V compound semiconductor materials (e.g., AlGaN), the dummy layer 170a is made of III-V compound semiconductor materials, such as GaAs. The dummy layer 170a is formed using an epitaxy process, in accordance with some embodiments.

As shown in FIG. 1A, a semiconductor layer 180a is formed over the dummy layer 170a, in accordance with some embodiments. The semiconductor layer 180a is made of silicon or the like, in accordance with some embodiments. In some embodiments, the semiconductor layer 180a is made of III-V compound semiconductor materials, such as GaN. In some embodiments, the semiconductor layer 180a is made of II-VI compound semiconductor materials. The semiconductor layer 180a is formed using an epitaxy process, in accordance with some embodiments.

Figure 1B:
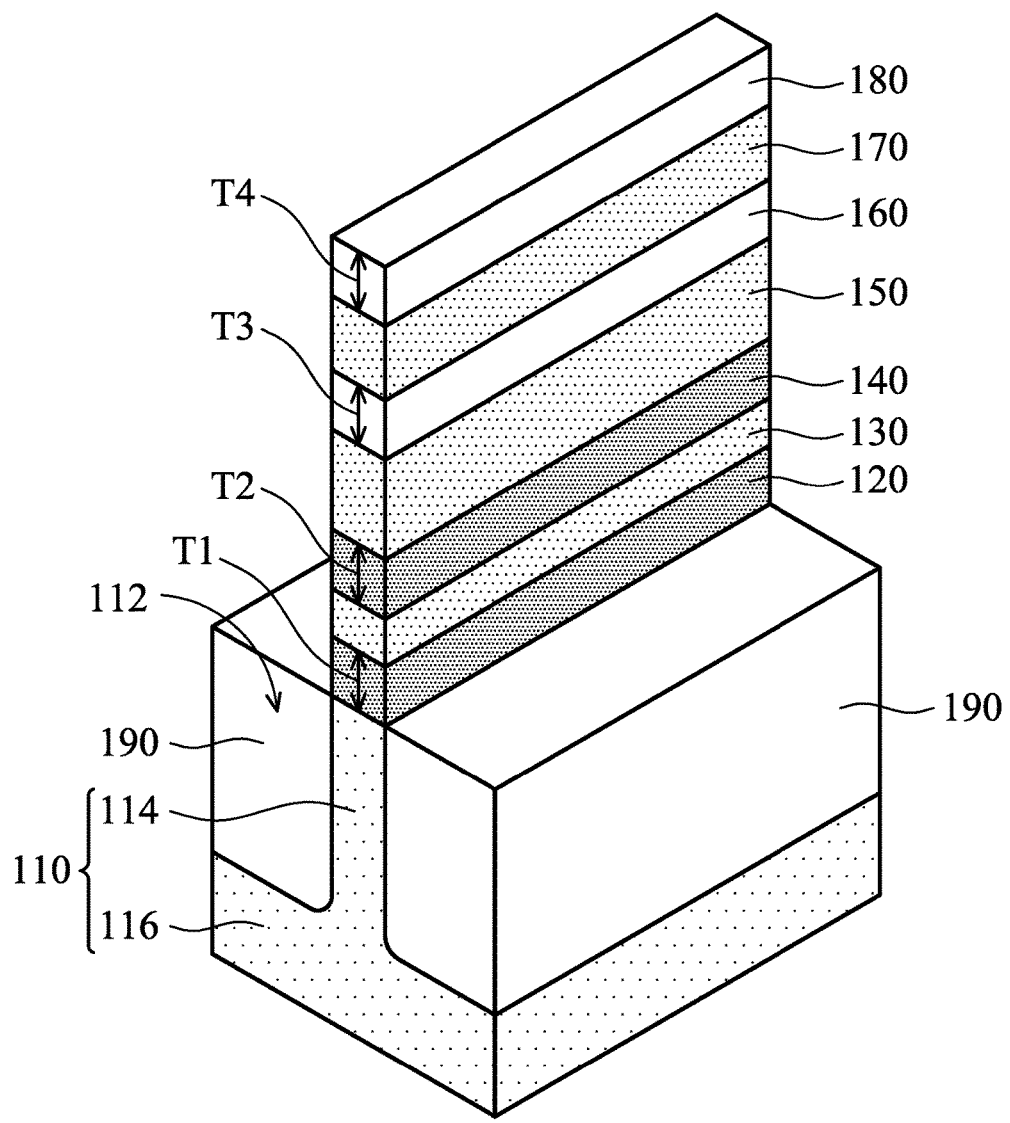

As shown in FIG. 1B, portions of the substrate 110, the semiconductor layers 120a, 140a, 160a, and 180a, and the dummy layers 130a, 150a, and 170a are removed, in accordance with some embodiments. After the removal process, the remaining semiconductor layers 120a, 140a, 160a, and 180a respectively form semiconductor wires 120, 140, 160, and 180, in accordance with some embodiments.

After the removal process, the remaining dummy layers 130a, 150a, and 170a respectively form dummy wires 130, 150, and 170, in accordance with some embodiments. The semiconductor wires 120, 140, 160, and 180 are separated (or spaced apart) from each other by the dummy wires 130, 150, and 170, in accordance with some embodiments. The semiconductor wires 120, 140, 160, and 180 and the fin portion 114 are parallel to each other, in accordance with some embodiments. The semiconductor wires 120, 140, 160, and 180 are nanowires, in accordance with some embodiments.

The semiconductor wires 120, 140, 160, and 180 respectively have thicknesses T1, T2, T3, and T4, in accordance with some embodiments. In some embodiments, the thicknesses T1, T2, T3, and T4 are the same. In some embodiments, the thicknesses T1, T2, T3, and T4 are different.

After the removal process, a recess 112 is formed in the substrate 110, in accordance with some embodiments. The recess 112 surrounds a fin portion 114 of the substrate 110, in accordance with some embodiments. The fin portion 114 is formed over a base portion 116 of the substrate 110, in accordance with some embodiments. The removal process includes a photolithography process and one or more etching processes, in accordance with some embodiments.

As shown in FIG. 1B, an isolation layer 190 is formed over the base portion 116 and surrounds the fin portion 114, in accordance with some embodiments. The fin portion 114 is embedded in the isolation layer 190, in accordance with some embodiments. The isolation layer 190 includes oxide (such as silicon dioxide), in accordance with some embodiments. The isolation layer 190 is formed by a deposition process (e.g., a chemical vapor deposition process), a chemical mechanical polishing process, and an etching back process, in accordance with some embodiments.

Figure 1C:
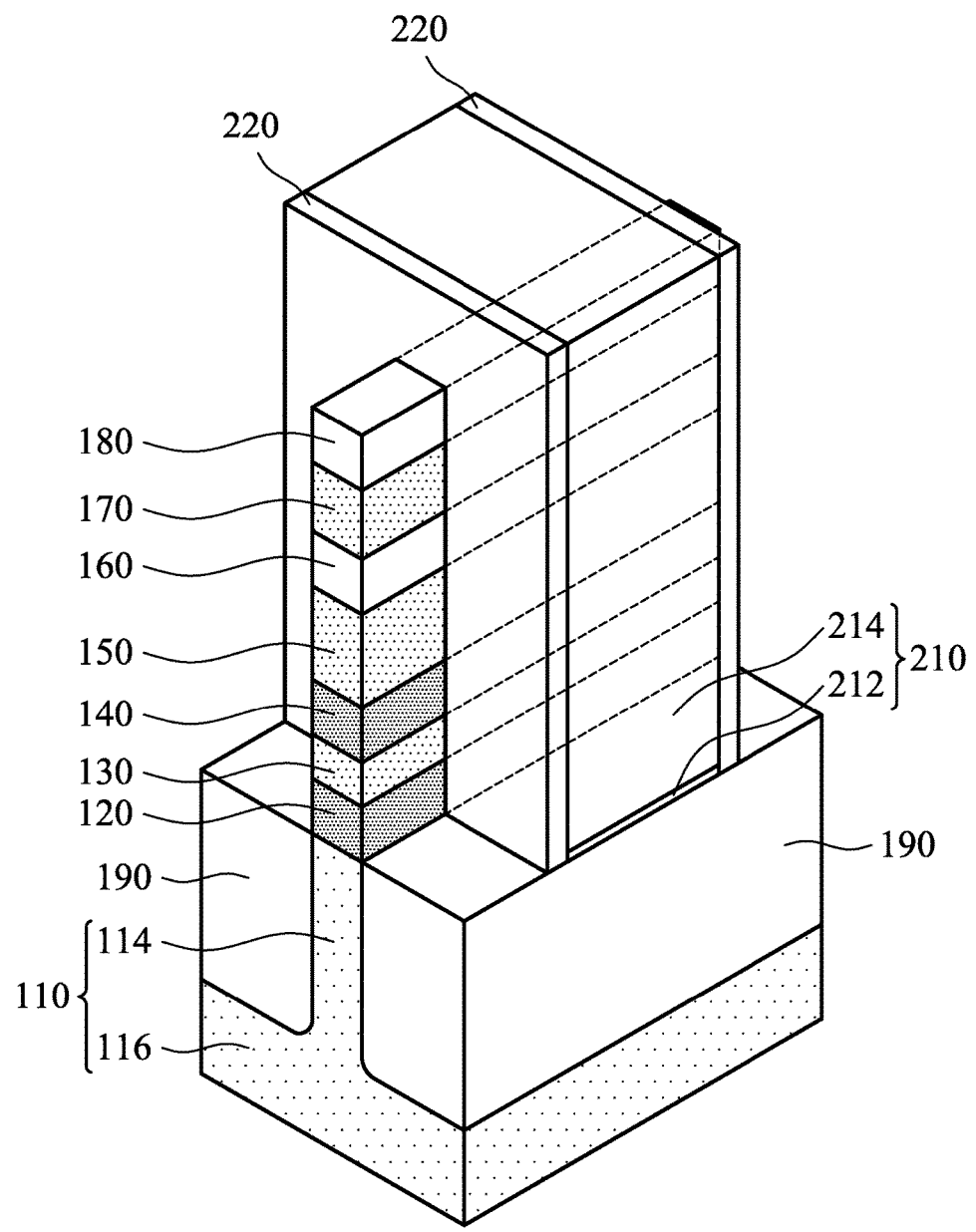

As shown in FIG. 1C, a dummy gate structure 210 is formed over the semiconductor wires 120, 140, 160, and 180, the dummy wires 130, 150, and 170, and the fin portion 114, in accordance with some embodiments. The dummy gate structure 210 partially surrounds the semiconductor wires 120, 140, 160, and 180 and the dummy wires 130, 150, and 170, in accordance with some embodiments. The dummy gate structure 210 is formed across the semiconductor wires 120, 140, 160, and 180, the dummy wires 130, 150, and 170, and the fin portion 114, in accordance with some embodiments.

The dummy gate structure 210 includes a gate dielectric layer 212 and a dummy gate electrode 214, in accordance with some embodiments. The gate dielectric layer 212 is made of oxides (e.g., silicon dioxides) or another suitable insulating material.

The dummy gate electrode 214 is formed over the gate dielectric layer 212, in accordance with some embodiments. The dummy gate electrode 214 may include a single layer or multilayer structure. In some embodiments, the dummy gate electrode 214 is made of polysilicon. The dummy gate electrode 214 may be formed by a procedure including deposition, photolithography patterning, and etching processes.

The deposition processes may include chemical vapor deposition (CVD), physical vapor deposition (PVD), atomic layer deposition (ALD), high density plasma CVD (HDP-CVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

As shown in FIG. 1C, a spacer layer 220 is formed on the sidewalls of dummy gate structure 210, in accordance with some embodiments. In some embodiments, the spacer layer 220 is made of silicon nitride, silicon dioxide, silicon oxynitride, silicon carbide, or another applicable dielectric material. The spacer layer 220 may include a single layer or multiple layers. The spacer layer 220 is in direct contact with the semiconductor wires 120, 140, 160, and 180, the dummy wires 130, 150, and 170, and the isolation layer 190, in accordance with some embodiments.

Figure 1D:
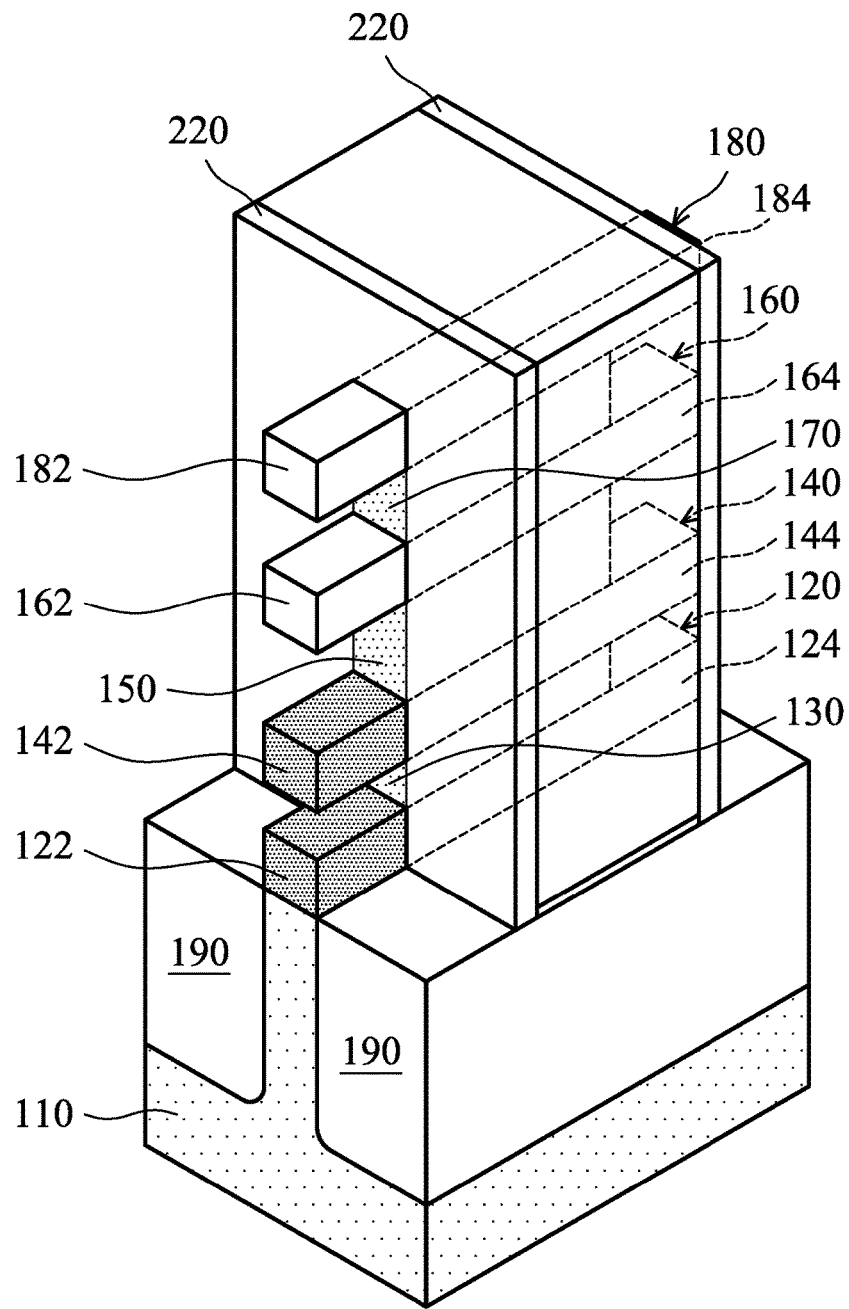

As shown in FIG. 1D, portions of the dummy wires 130, 150, and 170, which are not covered by the dummy gate structure 210 and the spacer layer 220, are removed, in accordance with some embodiments. The removal process includes a dry etching process or a wet etching process, in accordance with some embodiments.

The semiconductor wire 120 has opposite end portions 122 and 124, in accordance with some embodiments. The semiconductor wire 140 has opposite end portions 142 and 144, in accordance with some embodiments. The semiconductor wire 160 has opposite end portions 162 and 164, in accordance with some embodiments. The semiconductor wire 180 has opposite end portions 182 and 184, in accordance with some embodiments. The end portions 122, 124, 142, 144, 162, 164, 182, and 184 are not covered by the dummy gate structure 210 and the spacer layer 220, in accordance with some embodiments.

Figure 1E:
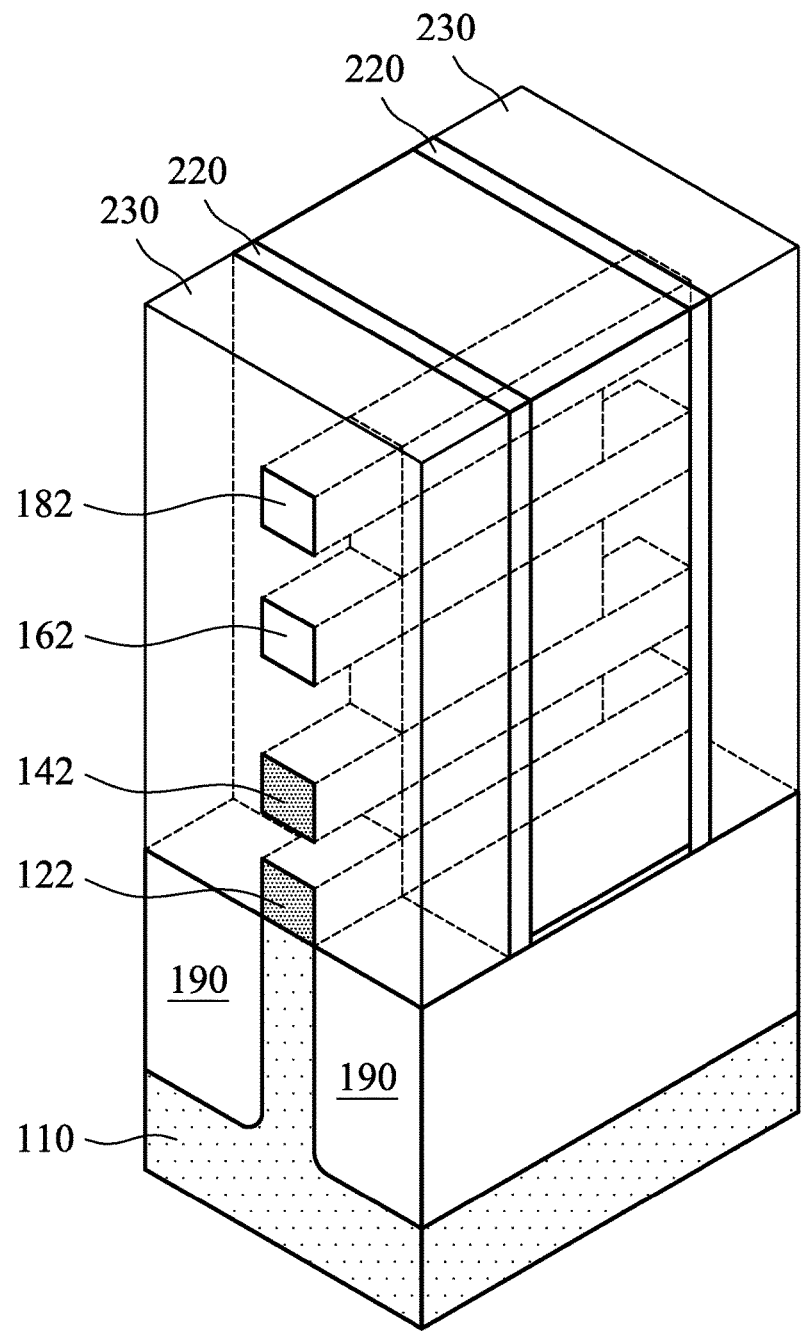

As shown in FIG. 1E, a stressor layer 230 is formed over the semiconductor wires 120, 140, 160, and 180 and the isolation layer 190, in accordance with some embodiments. The stressor layer 230 is in direct contact with the isolation layer 190 and the semiconductor wires 120, 140, 160, and 180, in accordance with some embodiments. The stressor layer 230 is made of a semiconductor material with a lattice constant that is different from the lattice constant of the semiconductor wires 120 and 140, in accordance with some embodiments.

The stressor layer 230 is made of $Si_{X'}Ge_{1-X'}$, and X' ranges from about 0.4 to about 0.5, in accordance with some embodiments. In some embodiments, X' is less than X. That is, the Ge concentration of the stressor layer 230 is greater than the Ge concentration of the semiconductor wires 120 and 140, in accordance with some embodiments.

In some embodiments, the stressor layer 230 is doped with one or more Group IIIA elements, such as boron. The boron concentration of the stressor layer 230 ranges from about $1*10^{18}$ cm$^{-3}$ to about $9*10^{18}$ cm$^{-3}$, in accordance with some embodiments. The stressor layer 230 is formed using an epitaxy process, in accordance with some embodiments.

Figure 1F:
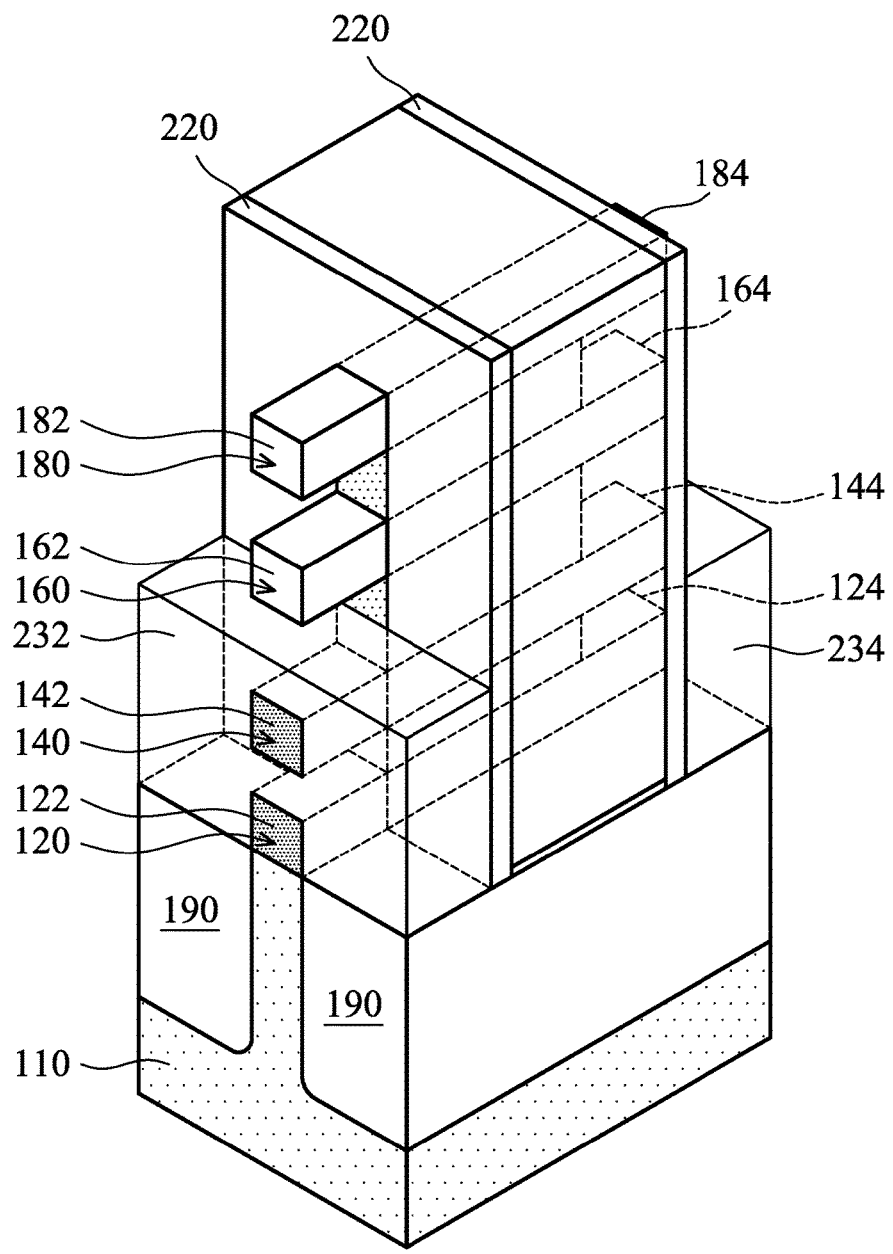

As shown in FIG. 1F, an upper portion of the stressor layer 230 is removed, in accordance with some embodiments. After the removal process, the remaining stressor layer 230 forms a first stressor 232 and a second stressor 234, in accordance with some embodiments. The first stressor 232 surrounds the end portions 122 and 142, in accordance with some embodiments.

The first stressor 232 surrounds the entire end portions 122 and 142, in accordance with some embodiments. The first stressor 232 is in direct contact with the end portions 122 and 142, in accordance with some embodiments. In some embodiments, a portion of the first stressor 232 is between the semiconductor wires 140 and 160.

The second stressor 234 surrounds the end portions 124 and 144, in accordance with some embodiments. The second stressor 234 surrounds the entire end portions 124 and 144, in accordance with some embodiments. The second stressor 234 is in direct contact with the end portions 124 and 144, in accordance with some embodiments.

The semiconductor wires 120 and 140, the first stressor 232, and the second stressor 234 have a P-type conductivity, in accordance with some embodiments. In some embodiments, a portion of the second stressor 234 is between the semiconductor wires 140 and 160. The semiconductor wires 160 and 180 are not covered by the first stressor 232 and the second stressor 234, in accordance with some embodiments.

Figure 1G:
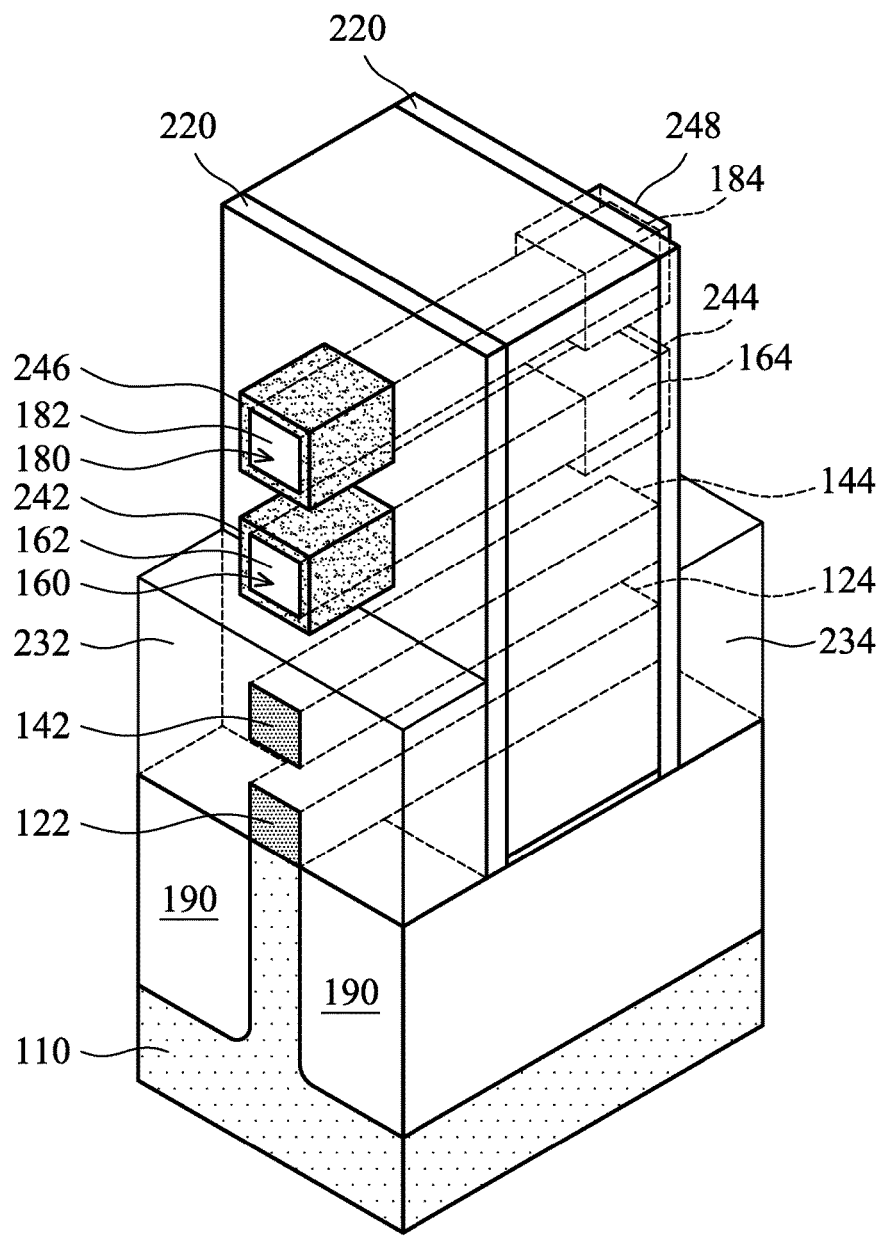

As shown in FIG. 1G, stressors 242, 244, 246, and 248 are respectively formed over the end portions 162, 164, 182, and 184, in accordance with some embodiments. The stressors 242, 244, 246, and 248 respectively surround the end portions 162, 164, 182, and 184, in accordance with some embodiments.

The stressors 242, 244, 246, and 248 are respectively in direct contact with the end portions 162, 164, 182, and 184, in accordance with some embodiments. The stressors 242, 244, 246, and 248 are made of a semiconductor material with a lattice constant that is different from the lattice constant of the semiconductor wires 160 and 180, in accordance with some embodiments. The stressors 242, 244, 246, and 248 are made of silicon or silicon carbide, in accordance with some embodiments. The stressors 242, 244, 246, and 248 are doped with Group VA elements, such as phosphor, in accordance with some embodiments.

The stressors 242, 244, 246, and 248 and the semiconductor wires 160 and 180 have a N-type conductivity, in accordance with some embodiments. Each of the stressors 232 or 234 is thicker than and wider than each of the stressors 242, 244, 246, or 248, in accordance with some embodiments. The stressors 242, 244, 246, and 248 are formed using an epitaxy process, in accordance with some embodiments.

Figure 1H:
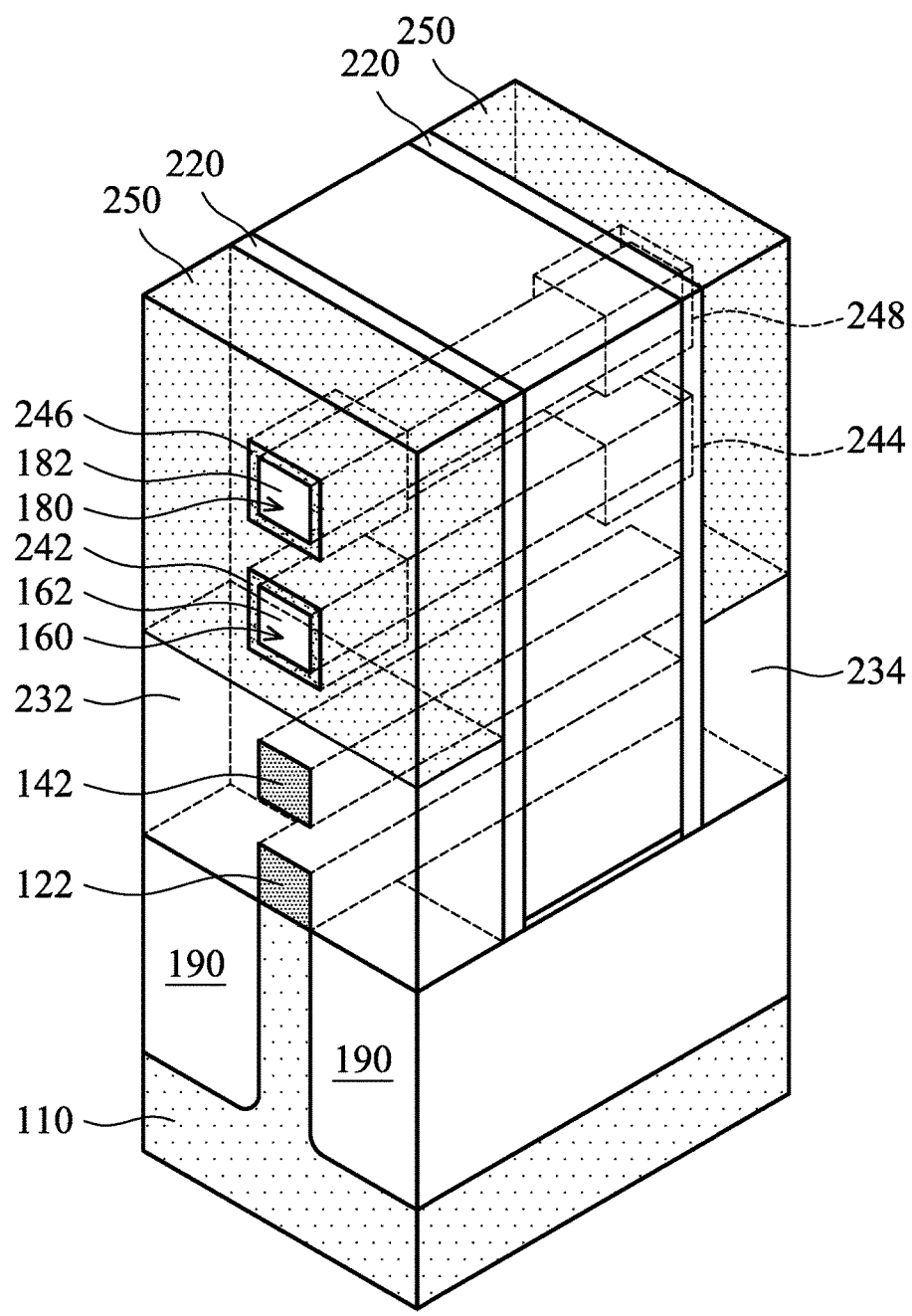

As shown in FIG. 1H, a dielectric layer 250 is formed over the first stressor 232, the second stressor 234, and the stressors 242, 244, 246, and 248, in accordance with some embodiments. The dielectric layer 250 surrounds the stressors 242, 244, 246, and 248 and the dummy gate structure 210, in accordance with some embodiments.

Figures 1, 1H, 2:
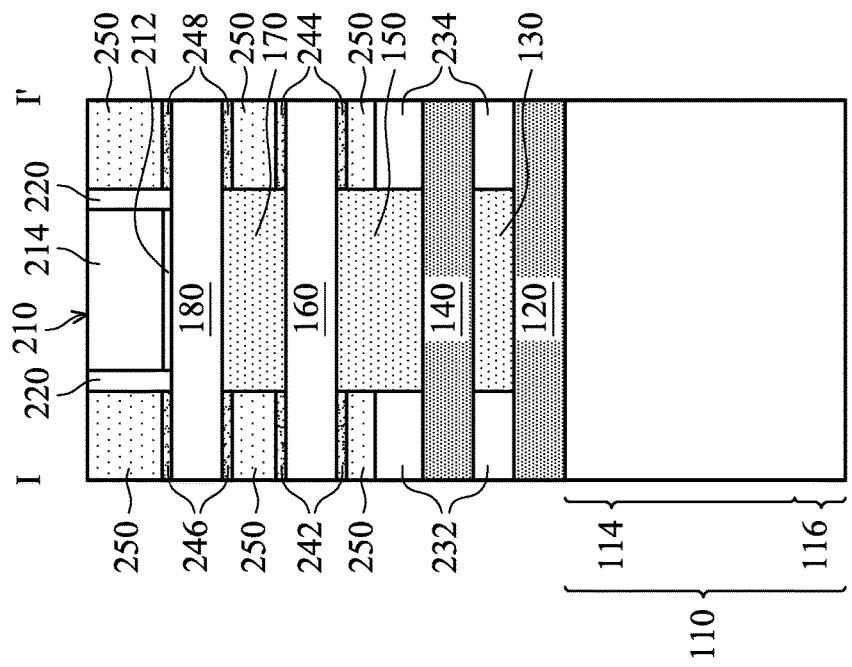
Figures 1, 1H:
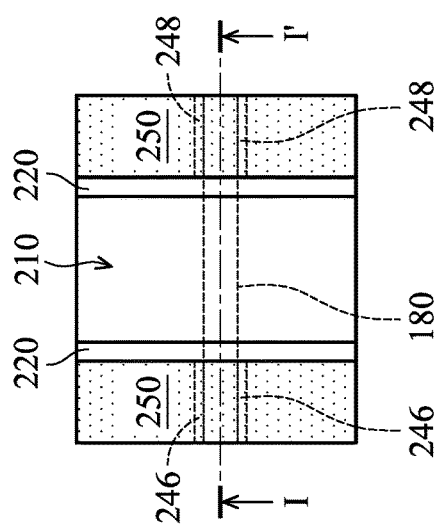

FIG. 1H-1 is a top view of the semiconductor device structure of FIG. 1H, in accordance with some embodiments. FIG. 1H-2 is a cross-sectional view illustrating the semiconductor device structure along a sectional line I-I' in FIG. 1H-1, in accordance with some embodiments. As shown in FIGS. 1H-1 and 1H-2, the dielectric layer 250 is positioned on opposite sides of the dummy wires 150 and 170, in accordance with some embodiments.

Figure 1I:
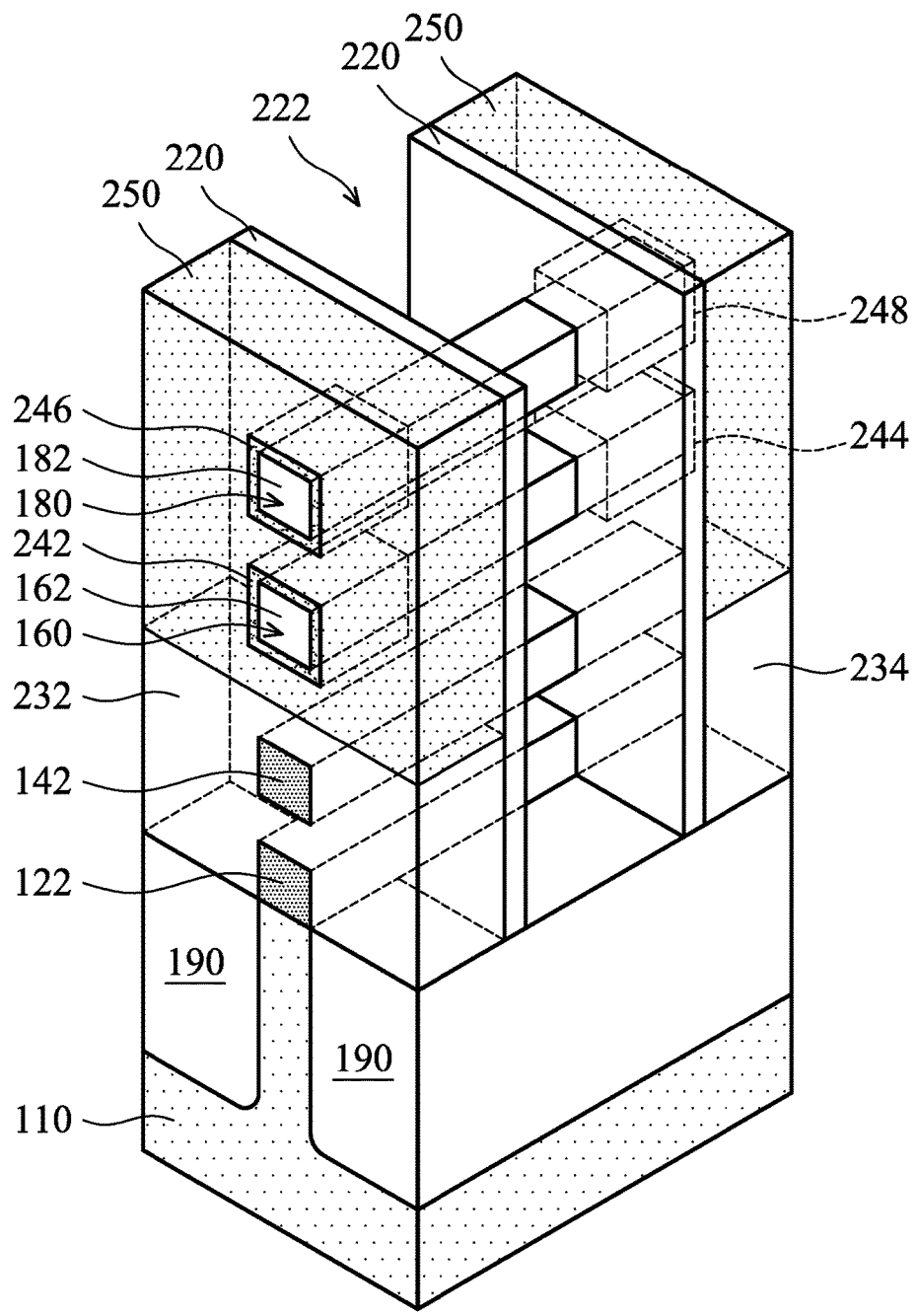
Figures 1, 1I, 2:
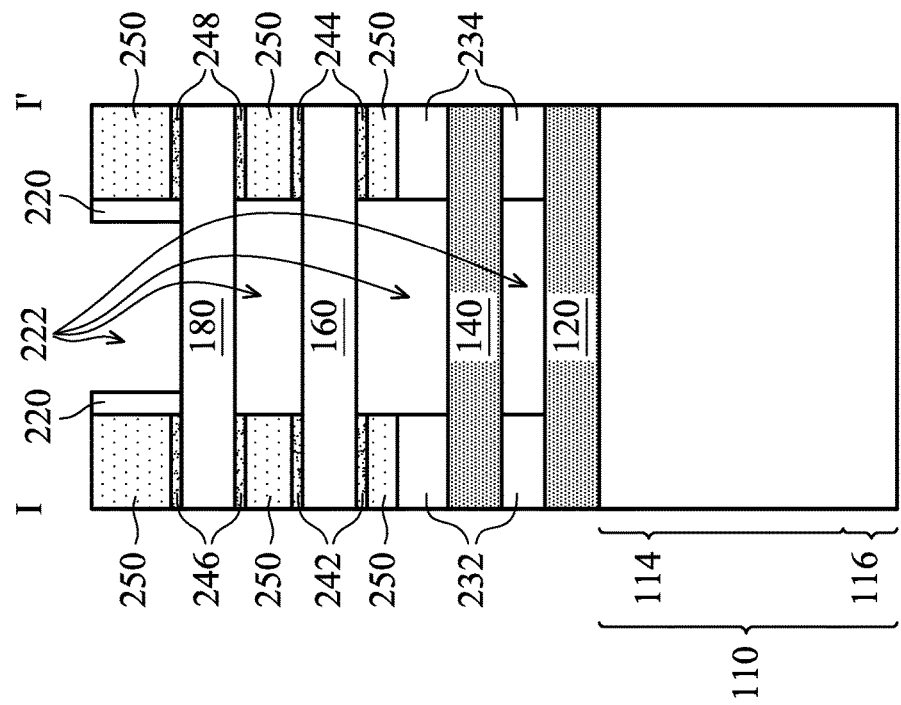
Figures 1, 1I:
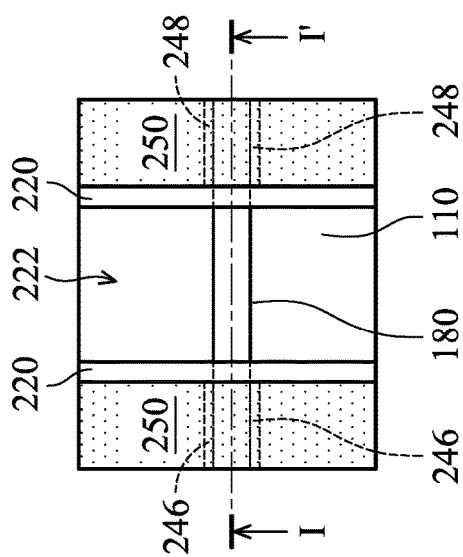

FIG. 1I-1 is a top view of the semiconductor device structure of FIG. 1I, in accordance with some embodiments. FIG. 1I-2 is a cross-sectional view illustrating the semiconductor device structure along a sectional line I-I' in FIG. 1I-1, in accordance with some embodiments. As shown in FIGS. 1I, 1I-1, and 1I-2, the dummy gate structure 210 and the dummy wires 130, 150, and 170 are removed, in accordance with some embodiments.

The removal process includes a wet etching process, in accordance with some embodiments. After the removal process, an opening 222 is formed in the spacer layer 220 and the dielectric layer 250 and is formed between the first stressor 232 and the second stressor 234, in accordance with some embodiments. The opening 222 exposes portions of the semiconductor wires 120, 140, 160, and 180, in accordance with some embodiments.

Figure 1J:
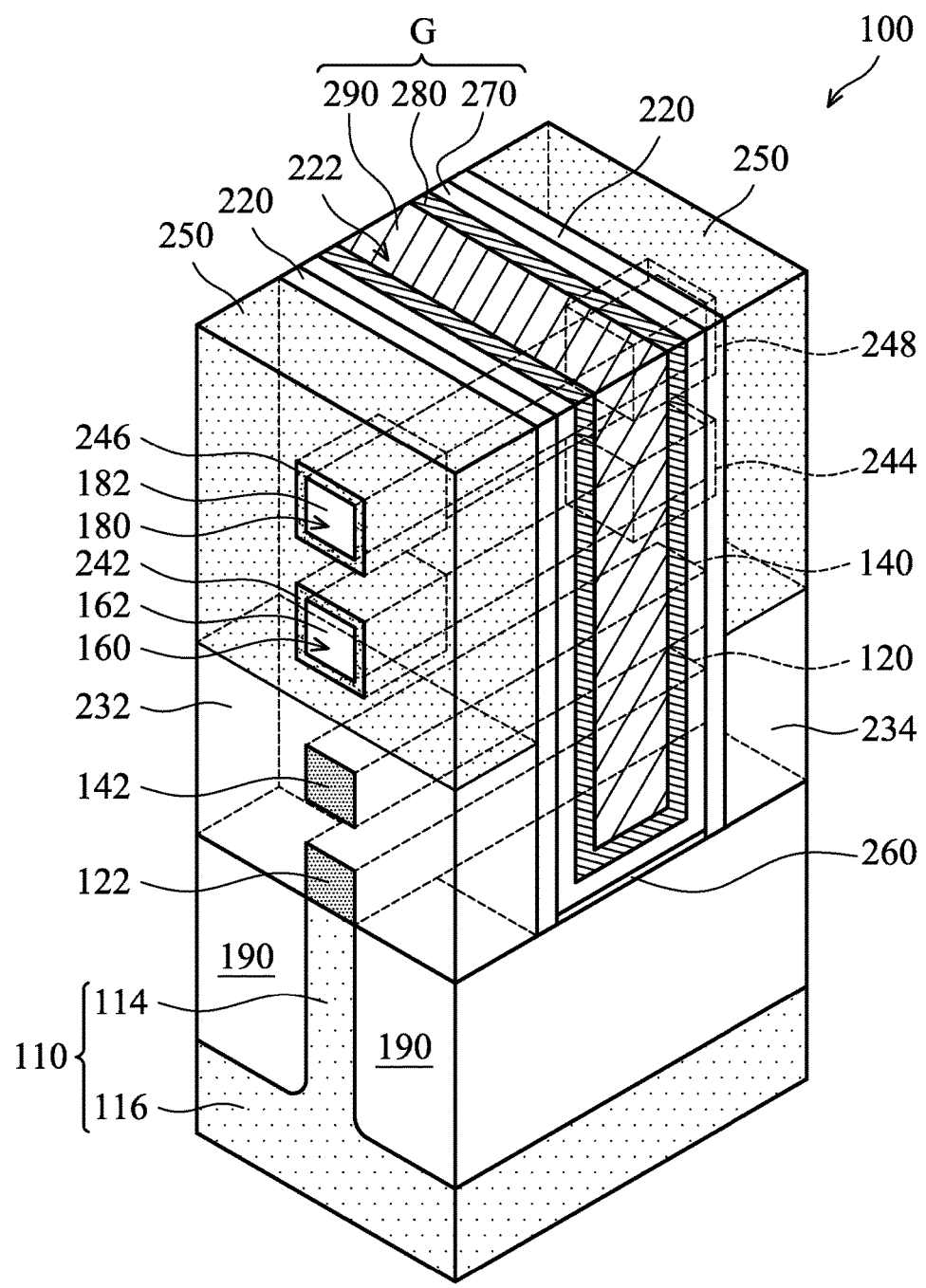
Figures 1, 1J, 2:
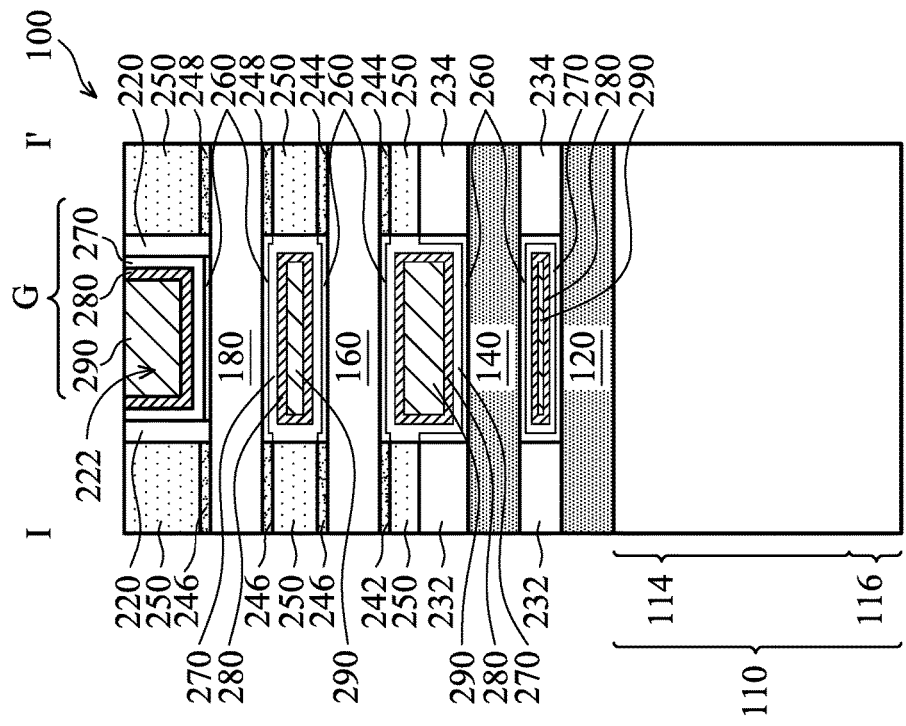
Figures 1, 1J:
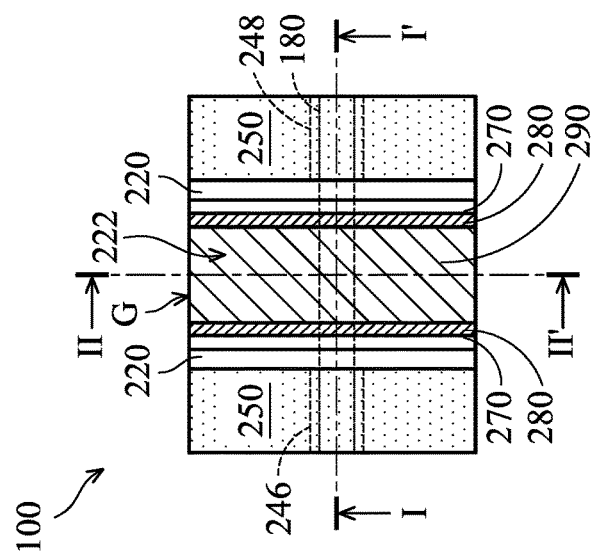

FIG. 1J-1 is a top view of the semiconductor device structure of FIG. 1J, in accordance with some embodiments. FIG. 1J-2 is a cross-sectional view illustrating the semiconductor device structure along a sectional line I-I' in FIG. 1J-1, in accordance with some embodiments. FIG. 1J-3 is a cross-sectional view illustrating the semiconductor device structure along a sectional line II-II' in FIG. 1J-1, in accordance with some embodiments.

As shown in FIGS. 1J, 1J-1, 1J-2, and 1J-3, an interfacial layer 260, a gate dielectric layer 270, a work function metal layer 280, and a gate electrode layer 290 are sequentially formed in the opening 222 and over the portions of the semiconductor wires 120, 140, 160, and 180 exposed by the opening 222, in accordance with some embodiments.

The interfacial layer 260 conformally covers the portions of the semiconductor wires 120, 140, 160, and 180 and the first stressor 232, the second stressor 234, the stressors 242, 244, 246, and 248 exposed by the opening 222, in accordance with some embodiments. The interfacial layer 260 is made of silicon dioxide or another suitable insulating material.

The formation of the interfacial layer 260 includes performing an oxidation process over the portions of the semiconductor wires 120, 140, 160, and 180, the first stressor 232, the second stressor 234, and the stressors 242, 244, 246, and 248 exposed by the opening 222, in accordance with some embodiments. The interfacial layer 260 is used to improve adhesion between the gate dielectric layer 270 and the portions of the semiconductor wires 120, 140, 160, and 180, the first stressor 232, the second stressor 234, and the stressors 242, 244, 246, and 248 exposed by the opening 222, in accordance with some embodiments.

The gate dielectric layer 270 is conformally formed over the interfacial layer 260 and portions of the spacer layer 220 and the dielectric layer 250 exposed by the opening 222, in accordance with some embodiments. The gate dielectric layer 270 is made of a high-K material, such as $HfO_2$, $ZrO_2$, $HfZrO_2$, or $Al_2O_3$.

The term "high-k material" means a material having a dielectric constant greater than the dielectric constant of silicon dioxide, in accordance with some embodiments. The gate dielectric layer 270 is formed using an atomic layer deposition process or another suitable process.

The work function metal layer 280 is conformally formed over the gate dielectric layer 270, in accordance with some embodiments. The work function metal layer 280 is made of TiN, TaN, TiSiN, or another suitable conductive material. The work function metal layer 280 is formed using an atomic layer deposition process, in accordance with some embodiments.

The gate electrode layer 290 is formed over the work function metal layer 280, in accordance with some embodiments. The gate electrode layer 290 is made of W, Co, Al, or another suitable conductive material. The gate electrode layer 290 is formed using an atomic layer deposition process or another suitable process.

The gate electrode layer 290, the work function metal layer 280, and the gate dielectric layer 270 together form a gate structure G, in accordance with some embodiments. The gate structure G may further include the interfacial layer 260. The gate structure G is over the fin portion 114 and extends across the fin portion 114, in accordance with some embodiments. The opening 222 is filled with the gate structure G, in accordance with some embodiments.

The semiconductor wires 120, 140, 160, and 180 pass through the gate structure G, in accordance with some embodiments. The gate structure G surrounds the semiconductor wires 140, 160, and 180, in accordance with some embodiments. The gate structure G partially surrounds the semiconductor wire 120, in accordance with some embodiments.

In this step, a semiconductor device structure 100 is formed, in accordance with some embodiments. The semiconductor device structure 100 includes the substrate 110, the semiconductor wires 120, 140, 160, and 180, and the gate structure G, in accordance with some embodiments. In the semiconductor device structure 100, the semiconductor wires 120 and 140 and the gate structure G together form a P-type transistor, and the semiconductor wires 160 and 180 and the gate structure G together form an N-type transistor, in accordance with some embodiments.

Since the N-type transistor with the semiconductor wires 160 and 180 is vertically stacked on the P-type transistor with the semiconductor wires 120 and 140, the area occupied by the N-type transistor and the P-type transistor of the semiconductor device structure 100 is less than the area occupied by an N-type transistor and a P-type transistor, which are horizontally arranged side by side. Therefore, the arrangement of the N-type transistor and the P-type transistor of the semiconductor device structure 100 may reduce the occupied area.

The semiconductor wires 120 and 140 are made of a P-type semiconductor material, and the semiconductor wires 160 and 180 are made of an N-type semiconductor material, which is different from the P-type semiconductor material, in accordance with some embodiments. Therefore, the threshold voltage of the P-type transistor and the threshold voltage of the N-type transistor may be individually adjusted according to design requirements by individually selecting the materials of the semiconductor wires 120, 140, 160, and 180. Furthermore, the performance of the semiconductor device structure 100 is improved by individually selecting the materials of the semiconductor wires 120, 140, 160, and 180.

In some other embodiments, the semiconductor wires 120 and 140 are made of an N-type semiconductor material, and the semiconductor wires 160 and 180 are made of a P-type semiconductor material, which is different from the N-type semiconductor material, in accordance with some embodiments. The N-type semiconductor material includes silicon, III-V compound semiconductor materials (e.g., GaN), II-VI compound semiconductor materials, or another suitable N-type semiconductor material.

The P-type semiconductor material includes $Si_XGe_{1-X}$ (X≈0.5-0.9), III-V compound semiconductor materials (e.g., AlGaN), II-VI compound semiconductor materials, or another suitable P-type semiconductor material. The first stressor 232 and the second stressor 234 are made of silicon or silicon carbide doped with Group VA elements, such as phosphor, in accordance with some embodiments. The stressors 242, 244, 246, and 248 are made of $Si_XGe_{1-X'}$ (X'≠0.4-0.5) doped with one or more Group IIIA elements, such as boron.

Figure 2A:
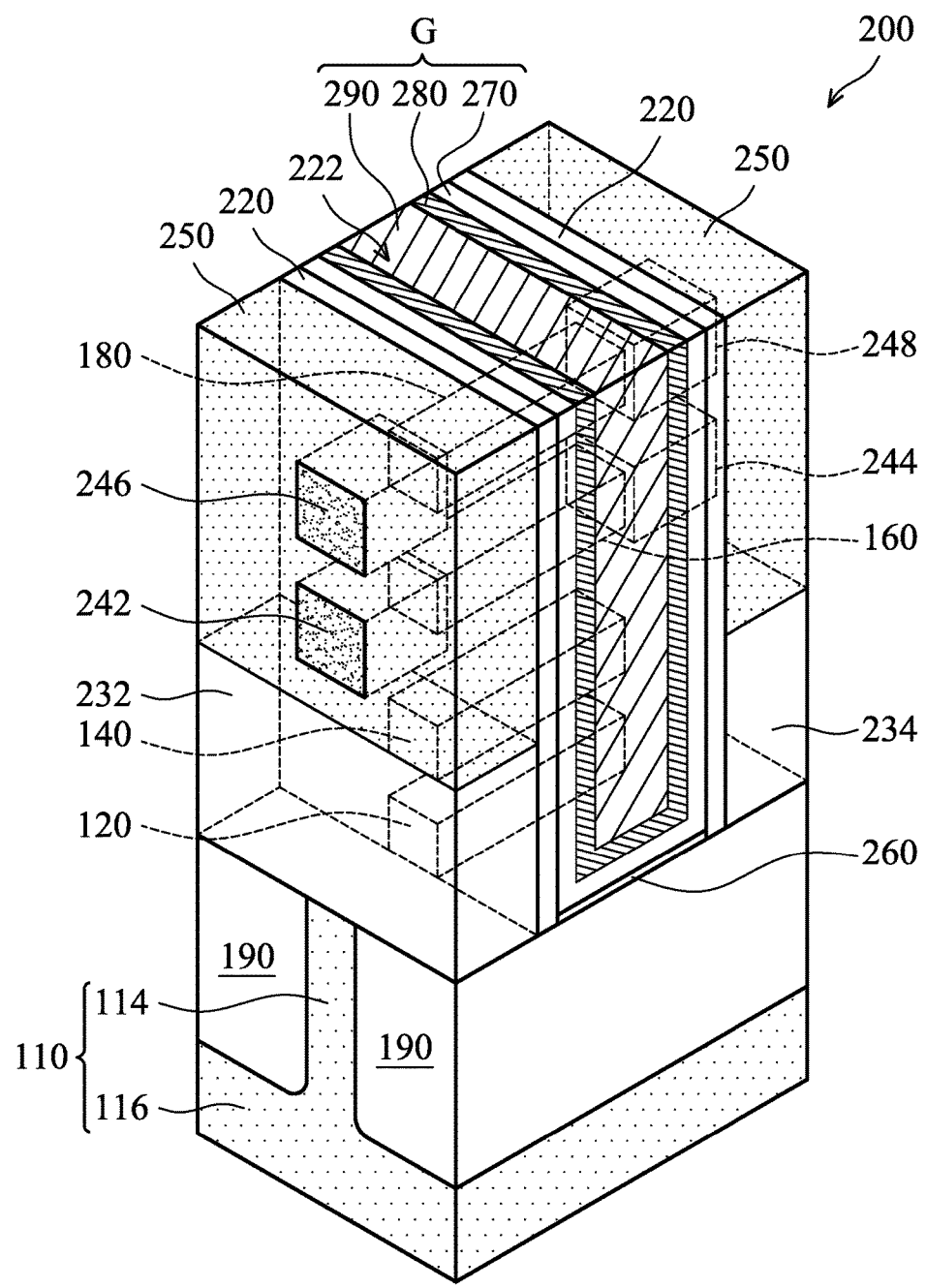
FIG. 2A is a perspective view of a semiconductor device structure, in accordance with some embodiments.
Figure 2C:
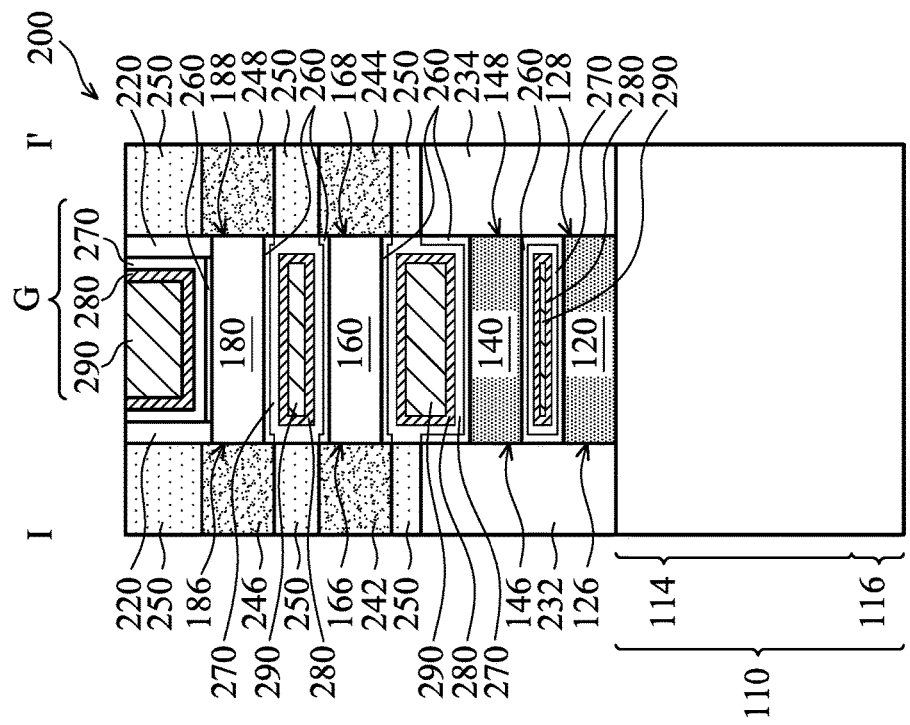
FIG. 2C is a cross-sectional view illustrating the semiconductor device structure along a sectional line I-I' in FIG. 2B, in accordance with some embodiments.
Figure 2B:
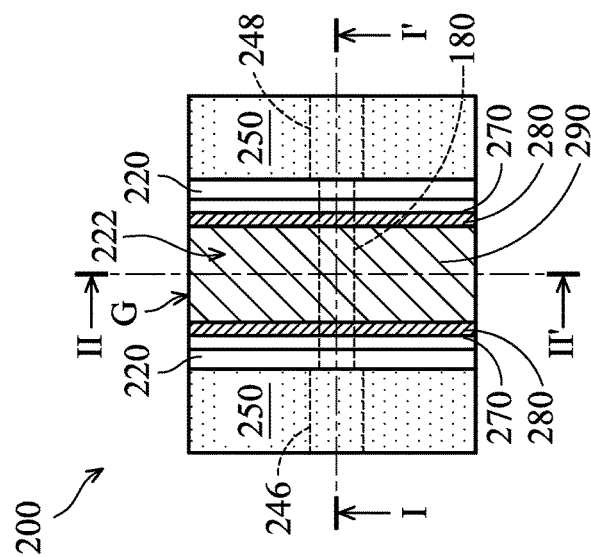
FIG. 2B is a top view of the semiconductor device structure of FIG. 2A, in accordance with some embodiments.
Figure 2D:
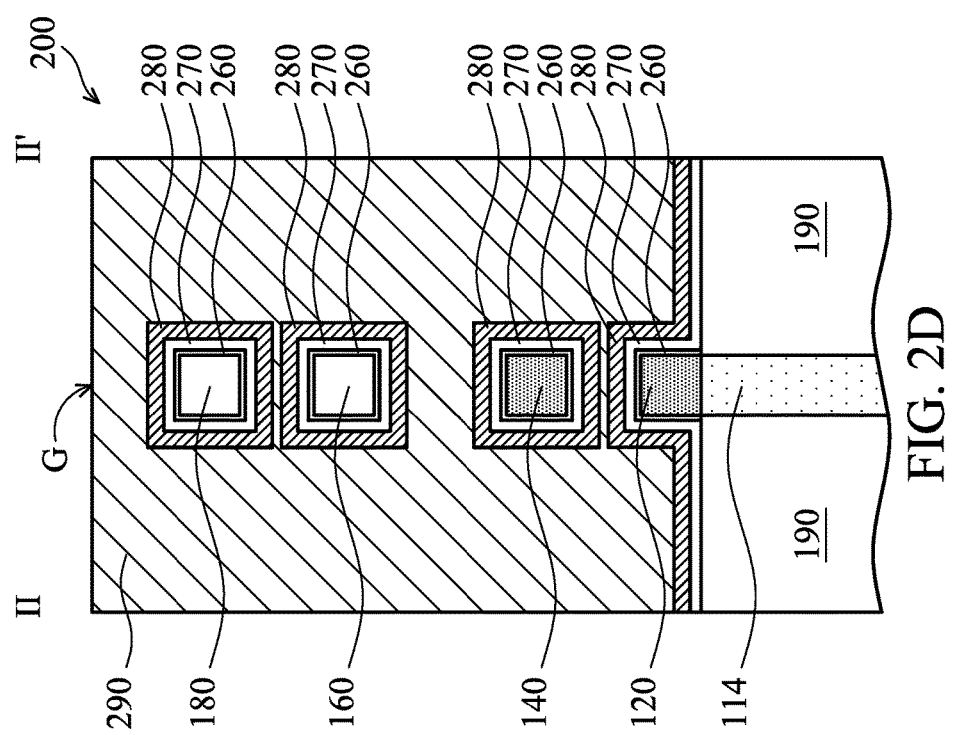
FIG. 2D is a cross-sectional view illustrating the semiconductor device structure along a sectional line II-II' in FIG. 2B, in accordance with some embodiments.

FIG. 2A is a perspective view of a semiconductor device structure, in accordance with some embodiments. FIG. 2B is a top view of the semiconductor device structure of FIG. 2A, in accordance with some embodiments. FIG. 2C is a cross-sectional view illustrating the semiconductor device structure along a sectional line I-I' in FIG. 2B, in accordance with some embodiments. FIG. 2D is a cross-sectional view illustrating the semiconductor device structure along a sectional line II-II' in FIG. 2B, in accordance with some embodiments.

After the step of FIG. 1D, the end portions 122, 124, 142, 144, 162, 164, 182, and 184 are removed, and then the steps of FIGS. 1E-1J are performed to form a semiconductor device structure 200 of FIG. 2A, in accordance with some embodiments. As shown in FIGS. 2A-2D, the first stressor 232 and the second stressor 234 are formed on opposite sides 126 and 128 of the semiconductor wire 120, in accordance with some embodiments.

The first stressor 232 and the second stressor 234 are formed on opposite sides 146 and 148 of the semiconductor wire 140, in accordance with some embodiments. The stressors 242 and 244 are formed on opposite sides 166 and 168 of the semiconductor wire 160, in accordance with some embodiments. The stressors 246 and 248 are formed on opposite sides 186 and 188 of the semiconductor wire 180, in accordance with some embodiments.

Figure 3A:
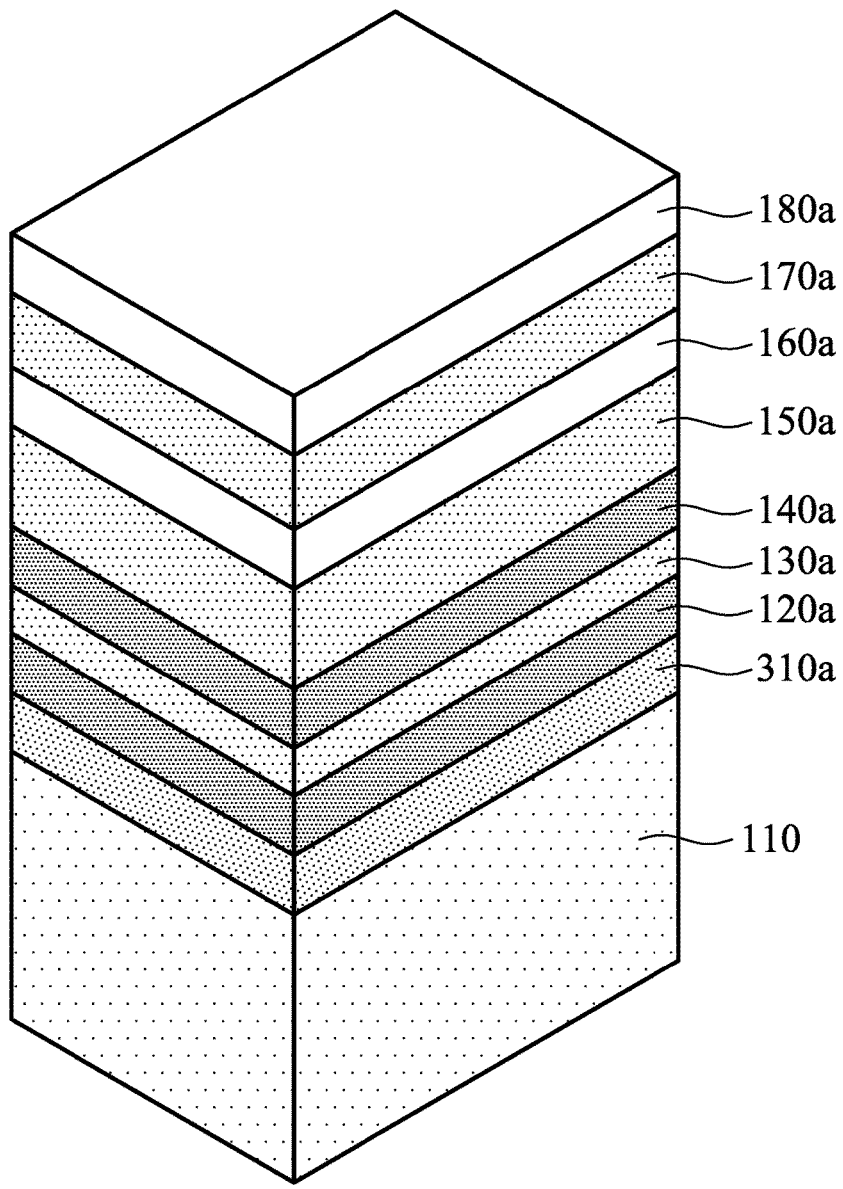
FIGS. 3A-3C are perspective views of various stages of a process for forming a semiconductor device structure, in accordance with some embodiments.
Figure 3B:
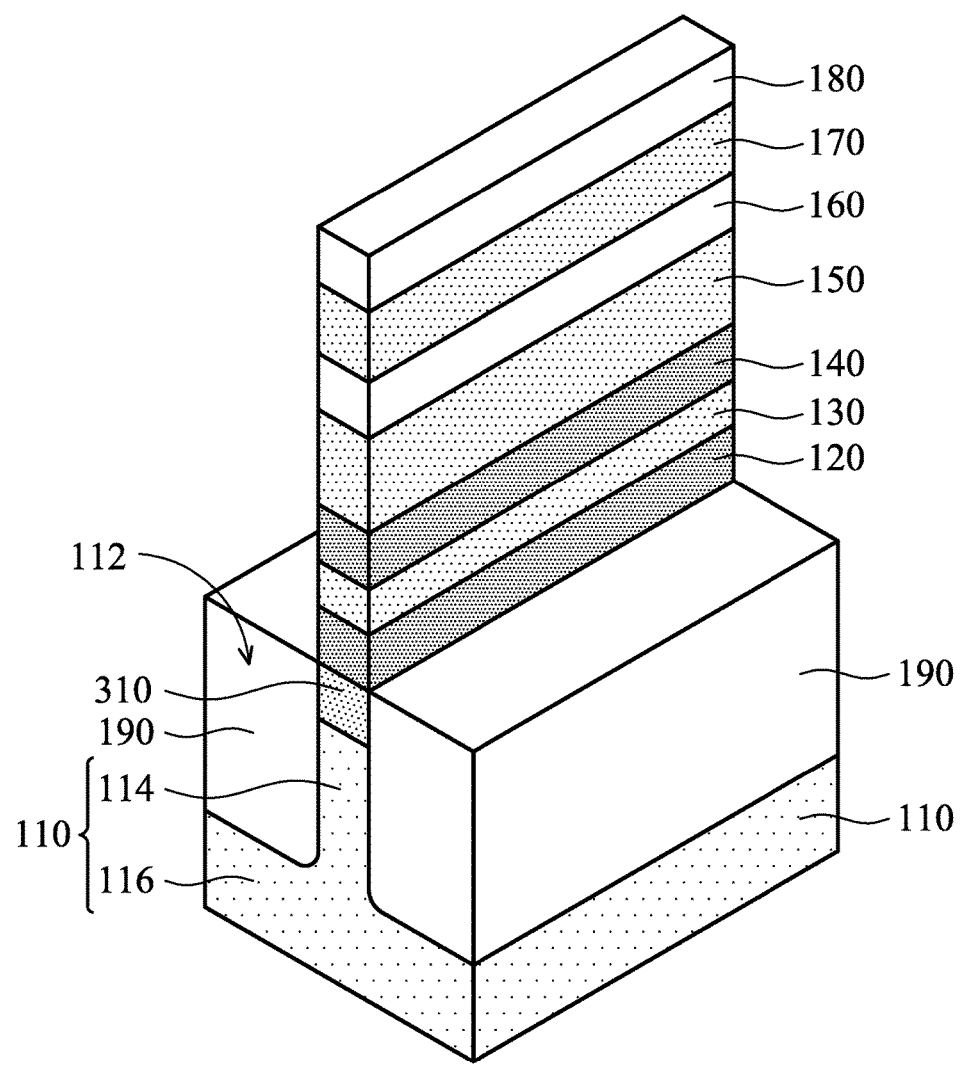
Figure 3C:
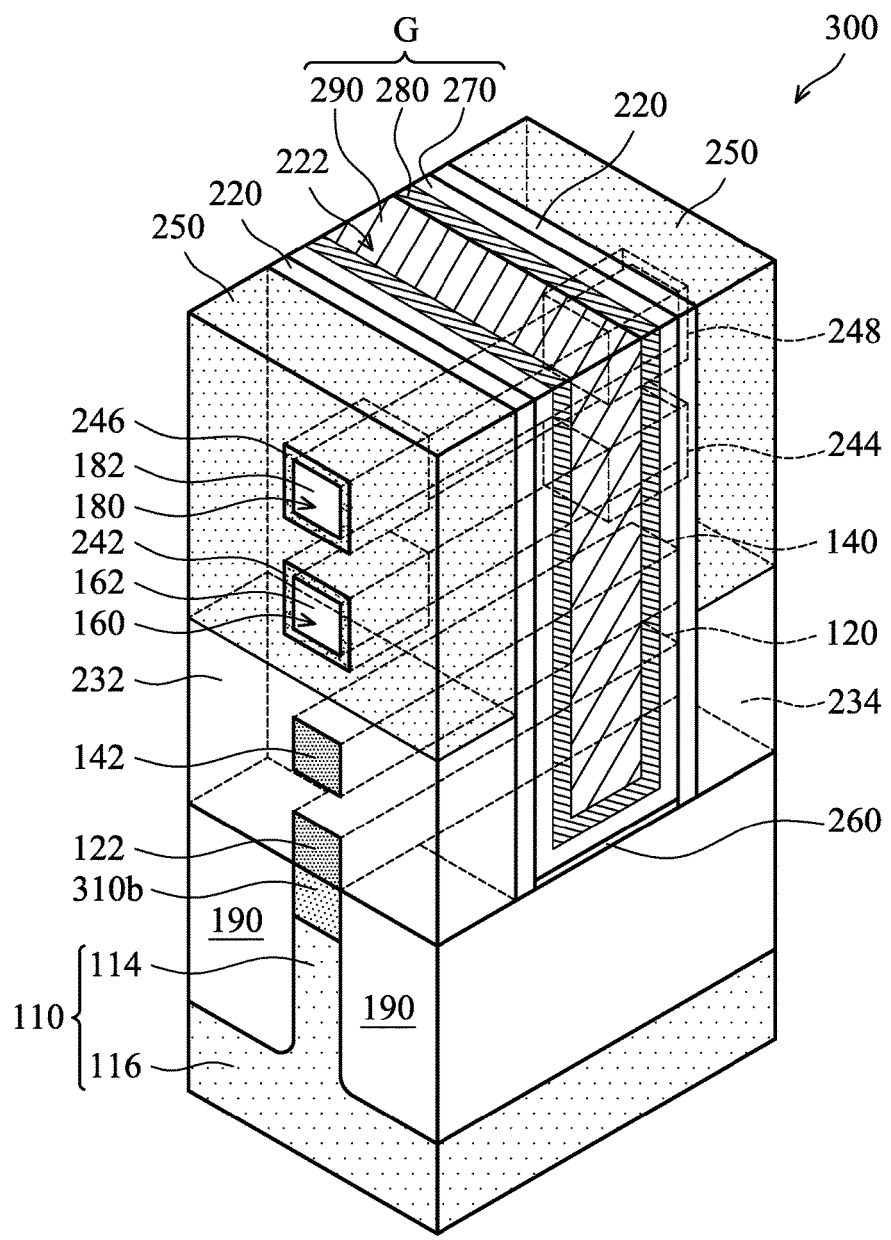
Figures 2, 3C:
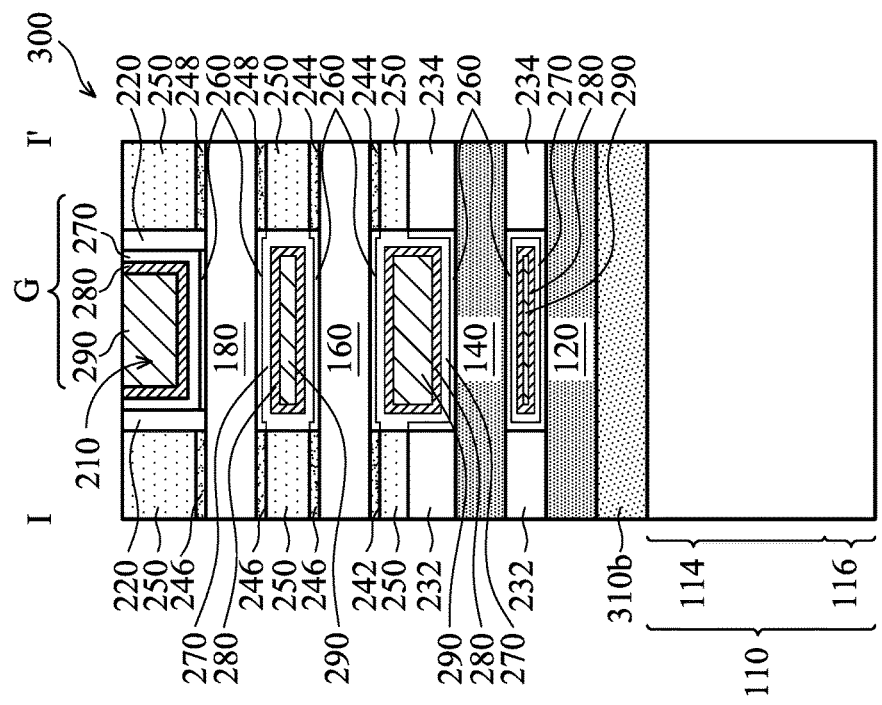
Figures 1, 3C:
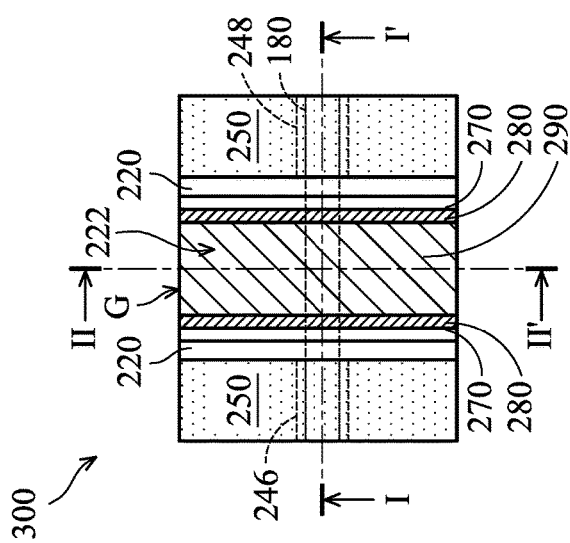
Figures 3, 3C:
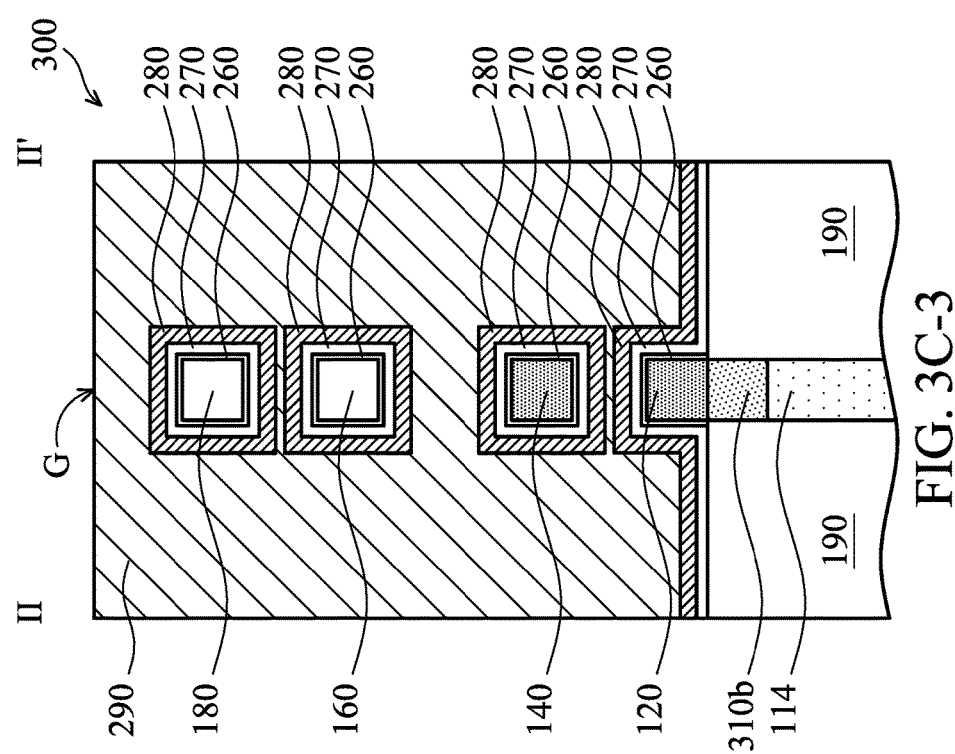

FIGS. 3A-3C are perspective views of various stages of a process for forming a semiconductor device structure, in accordance with some embodiments. As shown in FIG. 3A, the step of FIG. 1A is performed, and before the formation of the semiconductor layer 120a, a metal layer 310a is formed, in accordance with some embodiments. The metal layer 310a is made of Ge or another suitable metal material.

As shown in FIG. 3B, portions of the substrate 110, the metal layer 310a, the semiconductor layers 120a, 140a, 160a, and 180a, and the dummy layers 130a, 150a, and 170a are removed, in accordance with some embodiments. After the removal process, the remaining semiconductor layers 120a, 140a, 160a, and 180a respectively form semiconductor wires 120, 140, 160, and 180, in accordance with some embodiments.

After the removal process, the remaining dummy layers 130a, 150a, and 170a and the remaining metal layer 310a respectively form dummy wires 130, 150, and 170 and a metal line 310, in accordance with some embodiments. After the removal process, a recess 112 is formed in the substrate 110, in accordance with some embodiments. The recess 112 surrounds a fin portion 114 of the substrate 110, in accordance with some embodiments. The fin portion 114 is formed over a base portion 116 of the substrate 110, in accordance with some embodiments.

As shown in FIG. 3B, an isolation layer 190 is formed over the base portion 116 and surrounds the fin portion 114, in accordance with some embodiments. The fin portion 114 is embedded in the isolation layer 190, in accordance with some embodiments. The metal line 310 is partially or entirely embedded in the isolation layer 190, in accordance with some embodiments. The isolation layer 190 includes oxide (such as silicon dioxide) or another suitable insulating material, in accordance with some embodiments.

The steps of FIGS. 1C-1I are performed, and after the step of FIG. 1I, an oxidation process is performed on the metal line 310, in accordance with some embodiments. The metal line 310 is oxidized into a metal oxide line 310b (as shown in FIG. 3C), in accordance with some embodiments. The metal oxide line 310b is also referred to as an insulating layer, in accordance with some embodiments.

Figures 1, 1J, 2, 3:
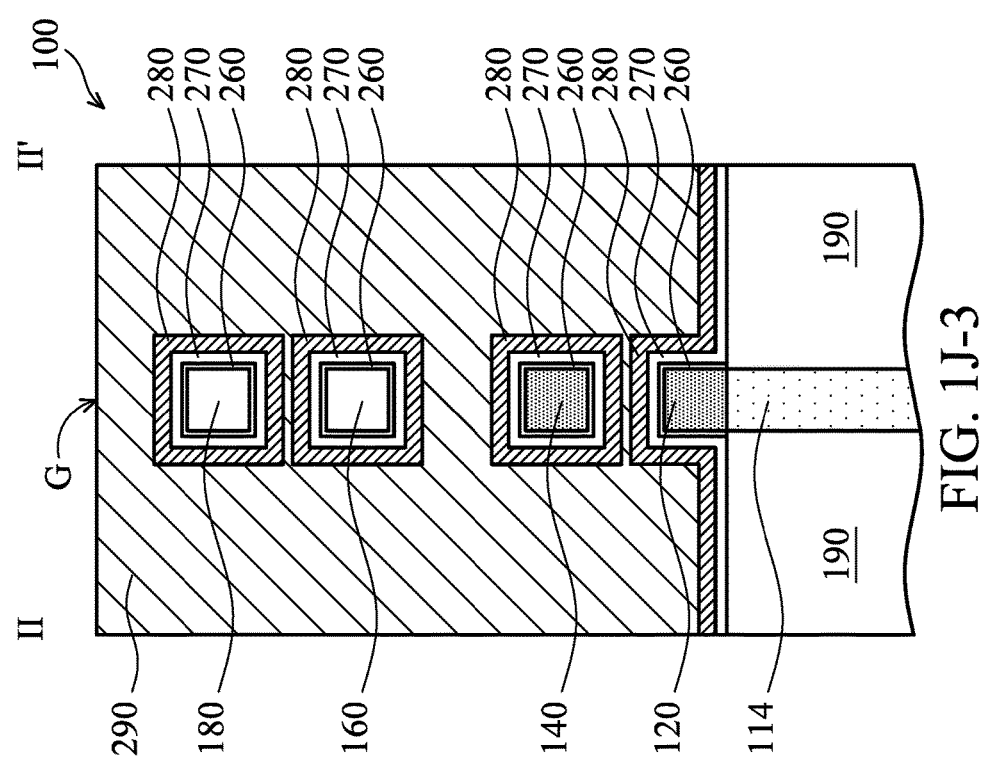

As shown in FIG. 3C, the step of FIG. 1J is performed to form a semiconductor device structure 300, in accordance with some embodiments. FIG. 3C-1 is a top view of the semiconductor device structure of FIG. 3C, in accordance with some embodiments. FIG. 3C-2 is a cross-sectional view illustrating the semiconductor device structure along a sectional line I-I' in FIG. 3C-1, in accordance with some embodiments. FIG. 3C-3 is a cross-sectional view illustrating the semiconductor device structure along a sectional line II-II' in FIG. 3C-1, in accordance with some embodiments.

As shown in FIGS. 3C, 3C-1, 3C-2, and 3C-3, the metal oxide line 310b is between the semiconductor wire 120 and the fin portion 114 to separate or electrically insulate the semiconductor wire 120 from the fin portion 114, in accordance with some embodiments. Therefore, the substrate 110 may be used as a back gate to adjust the threshold voltage of the transistor with the semiconductor wire 120. As a result, standby power dissipation of the semiconductor device structure 300 may be reduced.

Figure 4A:
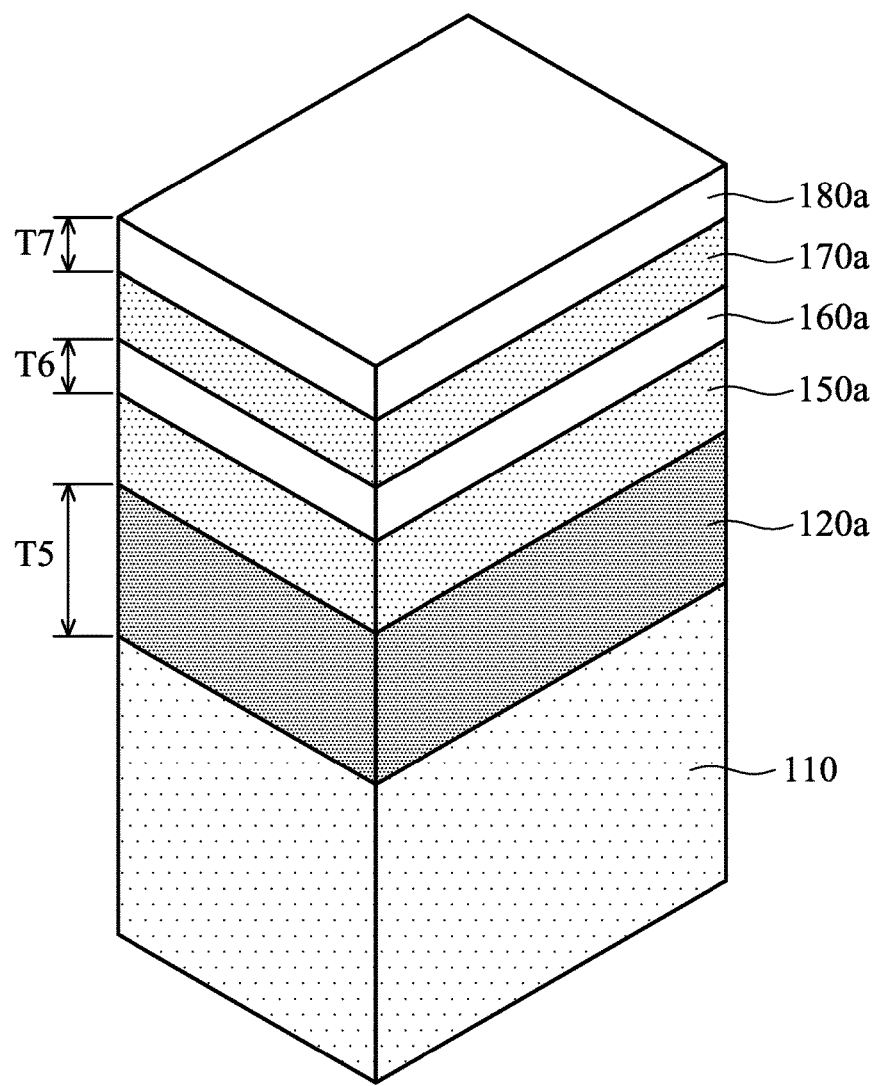
FIGS. 4A-4B are perspective views of various stages of a process for forming a semiconductor device structure, in accordance with some embodiments.
Figure 4B:
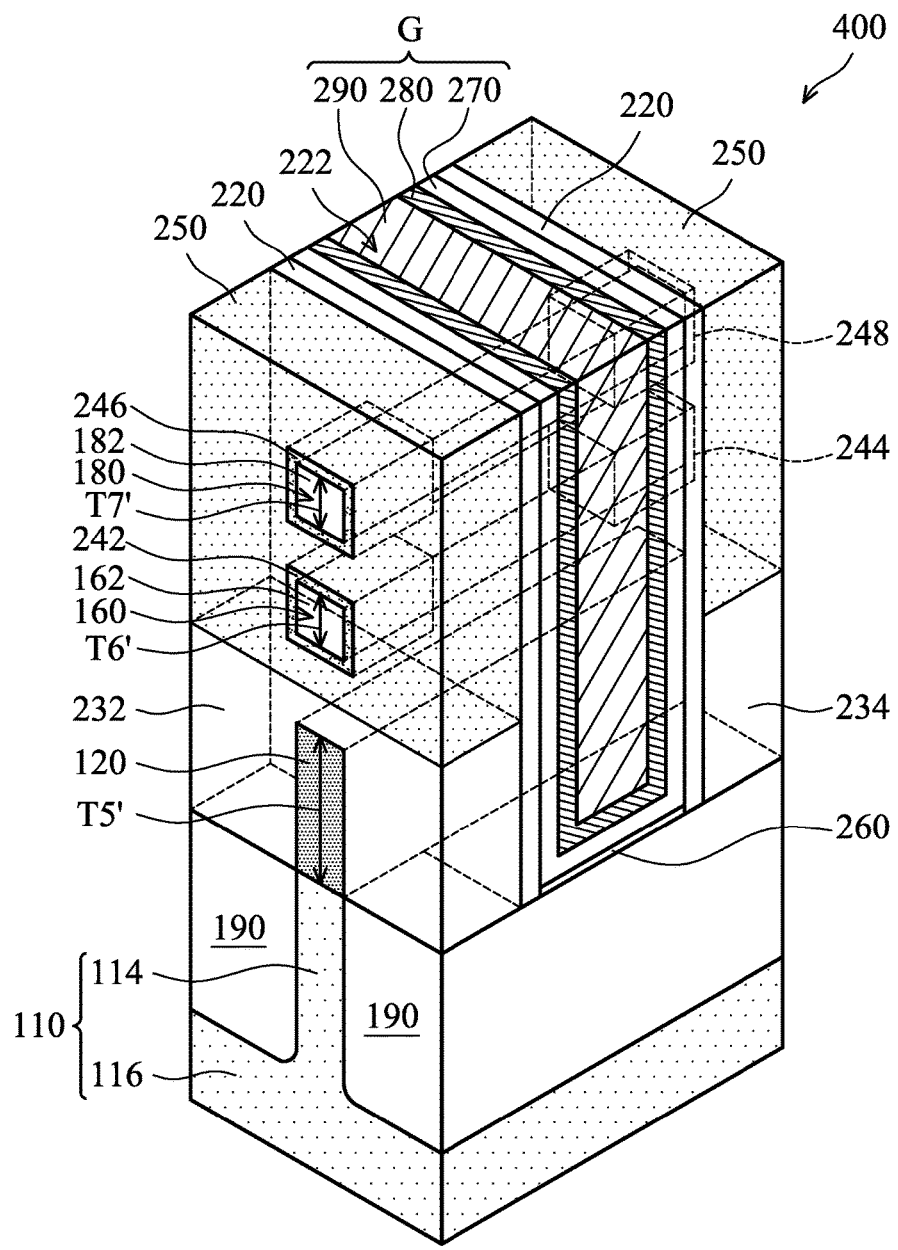

FIGS. 4A-4B are perspective views of various stages of a process for forming a semiconductor device structure, in accordance with some embodiments. As shown in FIG. 4A, the step of FIG. 1A is performed, except that the dummy layer 130a and the semiconductor layer 140a are not formed, in accordance with some embodiments. The thickness T5 of the semiconductor layer 120a is greater than the thickness T6 of the semiconductor layer 160a or the thickness T7 of the semiconductor layer 180a, in accordance with some embodiments.

As shown in FIG. 4B, the steps of FIGS. 1B-1J are performed to form a semiconductor device structure 400, in accordance with some embodiments. The thickness T5' of the semiconductor wire 120 is greater than the thickness T6' of the semiconductor wire 160 or the thickness T7' of the semiconductor wire 180, in accordance with some embodiments.

Figure 5A:
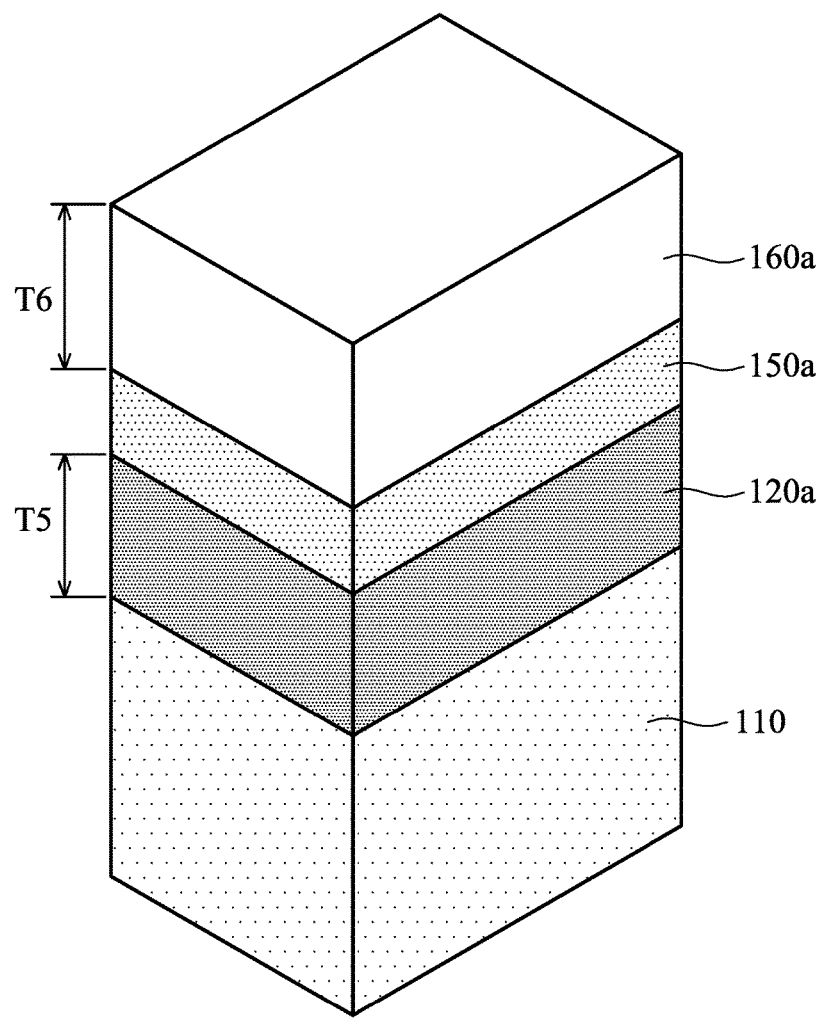
FIGS. 5A-5B are perspective views of various stages of a process for forming a semiconductor device structure, in accordance with some embodiments.
Figure 5B:
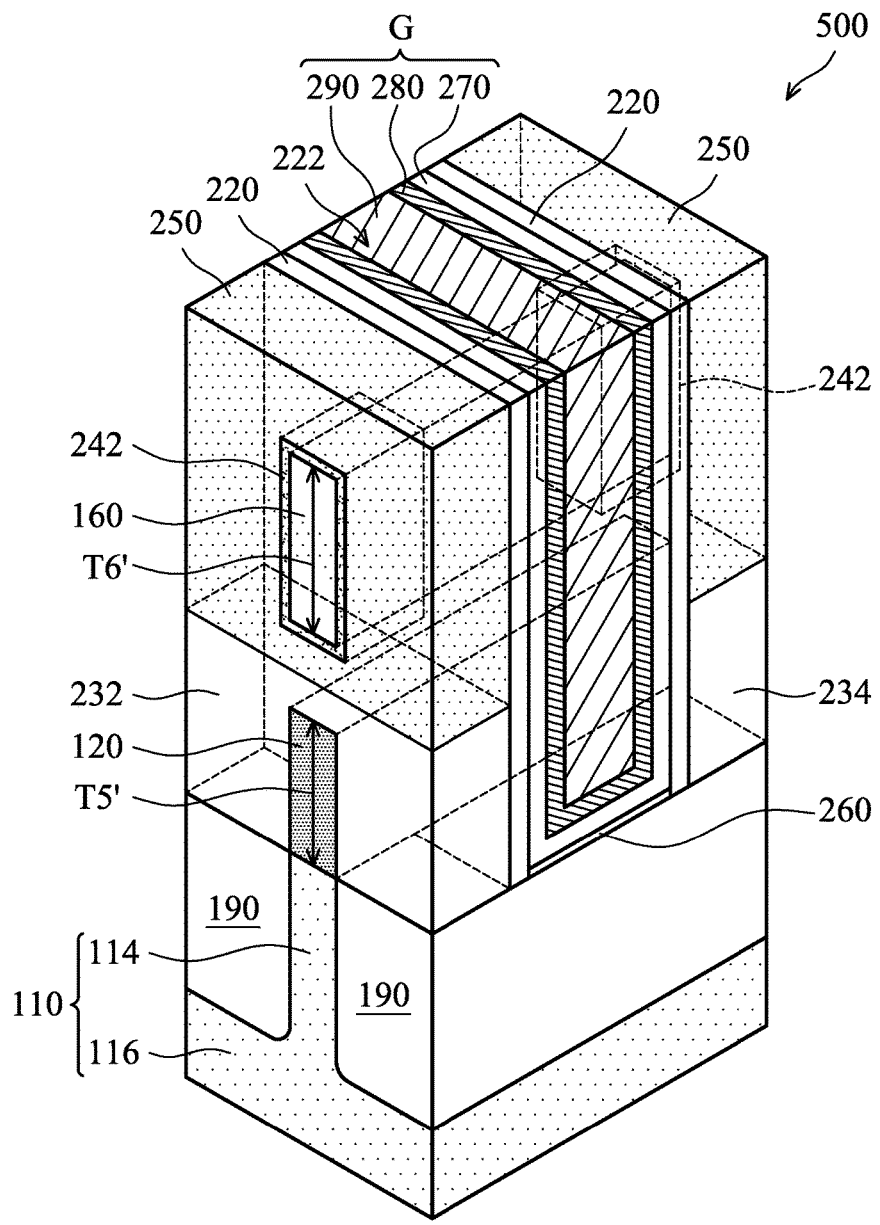

FIGS. 5A-5B are perspective views of various stages of a process for forming a semiconductor device structure, in accordance with some embodiments. As shown in FIG. 5A, the step of FIG. 1A is performed, except that the dummy layers 130a and 170a and the semiconductor layers 140a and 180a are not formed, in accordance with some embodiments. The thickness T5 of the semiconductor layer 120a may be the same as or different from the thickness T6 of the semiconductor layer 160a.

As shown in FIG. 5B, the steps of FIGS. 1B-1J are performed to form a semiconductor device structure 500, in accordance with some embodiments. The thickness T5' of the semiconductor wire 120 may be the same as or different from the thickness T6' of the semiconductor wire 160.

In accordance with some embodiments, semiconductor device structures and methods for forming the same are provided. The methods (for forming the semiconductor device structure) form a first semiconductor wire and a second semiconductor wire made of different materials to adjust threshold voltages of the semiconductor device structures and improve the performance of the semiconductor device structures.

In accordance with some embodiments, a semiconductor device structure is provided. The semiconductor device structure includes a substrate having a base portion and a fin portion over the base portion. The semiconductor device structure includes a gate structure over the fin portion and extending across the fin portion. The semiconductor device structure includes a first semiconductor wire over the fin portion and passing through the gate structure. The semiconductor device structure includes a second semiconductor wire over the first semiconductor wire and passing through the gate structure. The gate structure surrounds the second semiconductor wire and separates the first semiconductor wire from the second semiconductor wire. The first semiconductor wire and the second semiconductor wire are made of different materials.

In accordance with some embodiments, a semiconductor device structure is provided. The semiconductor device structure includes a substrate having a base portion and a fin portion over the base portion. The semiconductor device structure includes a gate structure over the fin portion and extending across the fin portion. The semiconductor device structure includes a first semiconductor wire over the fin portion and passing through the gate structure. The semiconductor device structure includes a second semiconductor wire over the first semiconductor wire and passing through the gate structure. The second semiconductor wire is spaced apart from the first semiconductor wire, and a first type conductivity of the first semiconductor wire is different from a second type conductivity of the second semiconductor wire.

In accordance with some embodiments, a semiconductor device structure is provided. The semiconductor device structure includes a substrate. The semiconductor device structure includes a gate structure over the substrate. The semiconductor device structure includes a first semiconductor wire on the substrate and passing through the gate structure. The first semiconductor wire is in direct contact with the substrate, and the first semiconductor wire and the substrate are made of different materials. The semiconductor device structure includes a second semiconductor wire over the first semiconductor wire and passing through the gate structure. The gate structure surrounds the second semiconductor wire. The first semiconductor wire is spaced apart from the second semiconductor wire, and the first semiconductor wire and the second semiconductor wire are made of different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a base portion and a fin portion over the base portion;
   a gate structure over the fin portion and extending across the fin portion;
   a first semiconductor wire over the fin portion and passing through the gate structure; and
   a second semiconductor wire over the first semiconductor wire and passing through the gate structure, wherein the gate structure surrounds the second semiconductor wire and separates the first semiconductor wire from the second semiconductor wire, the first semiconductor wire and the second semiconductor wire are made of different materials, and the first semiconductor wire or the second semiconductor wire is made of silicon.

2. The semiconductor device structure as claimed in claim 1, wherein one of the first semiconductor wire or the second semiconductor wire is made of $Si_XGe_{1-X}$, and X ranges from about 0.5 to about 0.9.

3. The semiconductor device structure as claimed in claim 1, further comprising:
   a first stressor and a second stressor over the fin portion and respectively on opposite sides of the gate structure, wherein the first stressor and the second stressor are connected to the first semiconductor wire.

4. The semiconductor device structure as claimed in claim 3, wherein the first semiconductor wire has a first end portion and a second end portion, the first end portion and the second end portion are not covered by the gate structure, the first end portion and the second end portion are respectively on the opposite sides of the gate structure, the first stressor surrounds the first end portion, the second stressor surrounds the second end portion, and the first stressor, the second stressor, and the first semiconductor wire have a same type conductivity.

5. The semiconductor device structure as claimed in claim 3, further comprising:
   a third stressor and a fourth stressor respectively on the opposite sides of the gate structure and connected to the second semiconductor wire.

6. The semiconductor device structure as claimed in claim 5, wherein the second semiconductor wire has a first end portion and a second end portion, the first end portion and the second end portion are not covered by the gate structure and are respectively on the opposite sides of the gate structure, the third stressor surrounds the first end portion, the fourth stressor surrounds the second end portion, and the third stressor, the fourth stressor, and the second semiconductor wire have a same type conductivity.

7. The semiconductor device structure as claimed in claim 6, wherein the first stressor is thicker than and wider than the third stressor.

8. The semiconductor device structure as claimed in claim 1, further comprising:
an insulating layer between the first semiconductor wire and the fin portion to separate the first semiconductor wire from the fin portion.

9. The semiconductor device structure as claimed in claim 8, further comprising:
an isolation layer over the base portion, wherein the fin portion and the insulating layer are embedded in the isolation layer.

10. A semiconductor device structure, comprising:
a substrate having a base portion and a fin portion over the base portion;
a gate structure over the fin portion and extending across the fin portion;
a first semiconductor wire over the fin portion and passing through the gate structure; and
a second semiconductor wire over the first semiconductor wire and passing through the gate structure, wherein the second semiconductor wire is spaced apart from the first semiconductor wire, a first type conductivity of the first semiconductor wire is different from a second type conductivity of the second semiconductor wire, and the first semiconductor wire or the second semiconductor wire is made of silicon.

11. The semiconductor device structure as claimed in claim 10, wherein the first type conductivity and the second type conductivity comprise an N-type conductivity and a P-type conductivity.

12. The semiconductor device structure as claimed in claim 10, wherein the first semiconductor wire is thicker than the second semiconductor wire.

13. The semiconductor device structure as claimed in claim 10 wherein the first semiconductor wire and the second semiconductor wire have a same thickness.

14. The semiconductor device structure as claimed in claim 10, further comprising:
a first stressor and a second stressor respectively on opposite sides of the gate structure and connected to the second semiconductor wire, wherein the second semiconductor wire has a first end portion and a second end portion, the first end portion and the second end portion are not covered by the gate structure and are respectively on the opposite sides of the gate structure, the first stressor surrounds the entire first end portion, the second stressor surrounds the entire second end portion, and the first stressor, the second stressor, and the second semiconductor wire have a same type conductivity.

15. The semiconductor device structure as claimed in claim 10, wherein the first semiconductor wire is in direct contact with the substrate.

16. A semiconductor device structure, comprising:
a substrate;
a gate structure over the substrate;
a first semiconductor wire on the substrate and passing through the gate structure, wherein the first semiconductor wire is in direct contact with the substrate, and the first semiconductor wire and the substrate are made of different materials; and
a second semiconductor wire over the first semiconductor wire and passing through the gate structure, wherein the gate structure surrounds the second semiconductor wire, the first semiconductor wire is spaced apart from the second semiconductor wire, and the first semiconductor wire and the second semiconductor wire are made of different materials.

17. The semiconductor device structure as claimed in claim 16, wherein the substrate and the second semiconductor wire are made of a same material.

18. The semiconductor device structure as claimed in claim 17, wherein the substrate and the second semiconductor wire are made of silicon.

19. The semiconductor device structure as claimed in claim 16, wherein the substrate has a base portion and a fin portion over the base portion, and the semiconductor device structure further comprises:
an isolation layer over the base portion, wherein the fin portion is embedded in the isolation layer; and
a first stressor and a second stressor over the fin portion and respectively on opposite sides of the gate structure, wherein the first stressor and the second stressor are connected to the first semiconductor wire and in direct contact with the isolation layer.

20. The semiconductor device structure as claimed in claim 19, wherein a portion of the first stressor is between the first semiconductor wire and the second semiconductor wire.

* * * * *